(12) United States Patent
Chandrachood et al.

(10) Patent No.: US 7,976,671 B2
(45) Date of Patent: Jul. 12, 2011

(54) MASK ETCH PLASMA REACTOR WITH VARIABLE PROCESS GAS DISTRIBUTION

(75) Inventors: Madhavi R. Chandrachood, Sunnyvale, CA (US); Michael N. Grimbergen, Redwood City, CA (US); Khiem K. Nguyen, San Jose, CA (US); Richard Lewington, Hayward, CA (US); Ibrahim M. Ibrahim, Santa Clara, CA (US); Sheeba J. Panayil, Santa Clara, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/589,426

(22) Filed: Oct. 30, 2006

(65) Prior Publication Data

US 2008/0102202 A1 May 1, 2008

(51) Int. Cl.
*H01L 21/3063* (2006.01)
*C23C 16/505* (2006.01)

(52) U.S. Cl. .......... 156/345.33; 118/715; 118/723 AN; 118/723 ER; 118/723 I; 118/723 R; 156/345.29; 156/345.34; 156/345.48

(58) Field of Classification Search .......... 118/715, 118/723 R, 723 AN, 723 ER, 723 I; 156/345.29, 156/345.33, 345.34, 345.48, 345.44
See application file for complete search history.

(56) References Cited

U.S. PATENT DOCUMENTS

| 4,558,845 A | * | 12/1985 | Hunkapiller | 251/331 |
| 5,074,456 A | | 12/1991 | Degner et al. | 228/121 |
| 5,083,590 A | * | 1/1992 | Gattolliat et al. | 137/870 |
| 5,269,847 A | * | 12/1993 | Anderson et al. | 118/715 |
| 5,419,924 A | * | 5/1995 | Nagashima et al. | 427/248.1 |

(Continued)

FOREIGN PATENT DOCUMENTS

JP 051360981 A 6/1993

(Continued)

OTHER PUBLICATIONS

Official Action Dated May 18, 2010, Issued in Co-Pending U.S. Appl. No. 11/589,598.

(Continued)

*Primary Examiner* — Ram N Kackar
*Assistant Examiner* — Satish Chandra
(74) *Attorney, Agent, or Firm* — Robert M. Wallace

(57) ABSTRACT

A plasma reactor for processing a workpiece such as a mask or wafer includes a vacuum chamber having a cylindrical side wall, a ceiling overlying the side wall and a ring supported on a top edge of the side wall and supporting the ceiling, the ring comprising an external surface and an interior surface. An RF plasma source power applicator and an RF source power generator coupled to the applicator furnish plasma source power. Plural passages extend in a radial direction through the ring from the external surface to the interior surface and are spaced apart along a circumference of the ring. A process gas supply furnishes process gas. An external gas flow conduit apparatus outside of the chamber extends around a circumference of the chamber and is coupled to the process gas supply. Plural external gas flow valves outside of the chamber are coupled to the external conduit at respective locations spaced apart along the conduit, each of the valves having: (a) a controlled gas output port coupled to a respective one of the plural passages at the external surface of the ring and (b) a valve control input. A gas valve configuration controller controls the valve control input of each of the valves.

16 Claims, 30 Drawing Sheets

U.S. PATENT DOCUMENTS

| | | | | |
|---|---|---|---|---|
| 5,522,934 | A * | 6/1996 | Suzuki et al. | 118/723 AN |
| 5,534,231 | A | 7/1996 | Savas | 216/67 |
| 5,620,523 | A * | 4/1997 | Maeda et al. | 118/723 IR |
| 5,658,418 | A | 8/1997 | Coronel et al. | 156/345.25 |
| 5,717,294 | A | 2/1998 | Sakai et al. | 315/111.41 |
| 5,724,144 | A | 3/1998 | Muller et al. | 356/382 |
| 5,772,771 | A * | 6/1998 | Li et al. | 118/723 I |
| 5,866,198 | A * | 2/1999 | Sato et al. | 427/124 |
| 5,876,119 | A | 3/1999 | Ishikawa et al. | 374/134 |
| 5,879,128 | A | 3/1999 | Tietz et al. | 414/757 |
| 5,885,358 | A * | 3/1999 | Maydan et al. | 118/723 R |
| 5,948,168 | A | 9/1999 | Shan et al. | 427/45.1 |
| 6,217,937 | B1 * | 4/2001 | Shealy | 427/255.25 |
| 6,228,438 | B1 | 5/2001 | Schmitt | 427/569 |
| 6,239,403 | B1 | 5/2001 | Dible et al. | 219/121.43 |
| 6,263,829 | B1 * | 7/2001 | Schneider et al. | 118/723 I |
| 6,353,210 | B1 | 3/2002 | Norrhakhsh et al. | 219/497 |
| 6,363,882 | B1 | 4/2002 | Hao et al. | 118/723 E |
| 6,388,382 | B1 | 5/2002 | Doi et al. | 315/111.51 |
| 6,412,437 | B1 | 7/2002 | Campbell et al. | 118/723 E |
| 6,413,867 | B1 | 7/2002 | Sarfaty et al. | 438/689 |
| 6,449,871 | B1 * | 9/2002 | Kholodenko et al. | 34/255 |
| 6,458,495 | B1 | 10/2002 | Tsai et al. | 430/5 |
| 6,557,593 | B2 * | 5/2003 | Siegele et al. | 141/63 |
| 6,806,653 | B2 | 10/2004 | Strang et al. | 315/111.71 |
| 6,829,056 | B1 * | 12/2004 | Barnes et al. | 356/326 |
| 6,896,737 | B1 | 5/2005 | Sandhu | 118/715 |
| 6,961,131 | B2 | 11/2005 | Usui et al. | 356/503 |
| 7,271,096 | B2 * | 9/2007 | Sandhu | 438/680 |
| 7,537,672 | B1 | 5/2009 | Kushiishi et al. | 156/345.47 |
| 2001/0054483 | A1 | 12/2001 | Collins et al. | 156/345 |
| 2002/0000198 | A1 * | 1/2002 | Ishikawa et al. | 118/715 |
| 2002/0009814 | A1 | 1/2002 | Usui et al. | 438/8 |
| 2002/0101167 | A1 * | 8/2002 | Shan et al. | 315/111.11 |
| 2002/0146512 | A1 * | 10/2002 | Rossman | 427/255.28 |
| 2002/0192369 | A1 * | 12/2002 | Morimoto et al. | 427/248.1 |
| 2003/0005958 | A1 * | 1/2003 | Rocha-Alvarez et al. | 137/118.01 |
| 2003/0029564 | A1 | 2/2003 | Brown et al. | 156/345.1 |
| 2003/0070620 | A1 * | 4/2003 | Cooperberg et al. | 118/723 AN |
| 2003/0124820 | A1 | 7/2003 | Johnsgard et al. | 438/482 |
| 2003/0129835 | A1 * | 7/2003 | Kholodenko et al. | 438/689 |
| 2003/0137250 | A1 | 7/2003 | Mitrovic | 315/111.21 |
| 2003/0141795 | A1 | 7/2003 | Strang et al. | 313/146 |
| 2003/0151272 | A1 | 8/2003 | Tsuchiya et al. | 315/111.81 |
| 2003/0155079 | A1 * | 8/2003 | Bailey et al. | 156/345.49 |
| 2003/0176000 | A1 | 9/2003 | Otsubo et al. | 438/14 |
| 2004/0025787 | A1 * | 2/2004 | Selbrede et al. | 118/715 |
| 2004/0062874 | A1 * | 4/2004 | Kim et al. | 427/421 |
| 2004/0108068 | A1 | 6/2004 | Senzaki et al. | 156/345.43 |
| 2004/0261712 | A1 * | 12/2004 | Hayashi et al. | 118/723 E |
| 2005/0051271 | A1 | 3/2005 | Collins et al. | 156/345.31 |
| 2005/0082007 | A1 | 4/2005 | Nguyen et al. | 156/345.51 |
| 2005/0095779 | A1 | 5/2005 | Usuami | 438/232 |
| 2005/0241583 | A1 | 11/2005 | Buechel et al. | 118/723 E |
| 2005/0263247 | A1 | 12/2005 | Samukawa et al. | 156/345.24 |
| 2006/0043067 | A1 | 3/2006 | Kadkhodayan et al. | 216/67 |
| 2006/0073683 | A1 * | 4/2006 | Collins et al. | 438/510 |
| 2006/0191638 | A1 | 8/2006 | Dalton et al. | 156/345.43 |
| 2006/0219362 | A1 * | 10/2006 | Han et al. | 156/345.33 |
| 2007/0048869 | A1 * | 3/2007 | Lee et al. | 436/55 |
| 2007/0075037 | A1 | 4/2007 | Chang et al. | 216/59 |
| 2007/0166477 | A1 * | 7/2007 | Chang | 427/446 |

FOREIGN PATENT DOCUMENTS

| | | | |
|---|---|---|---|
| JP | 10298787 | A | 11/1998 |
| JP | 2000200783 | A | 7/2000 |
| JP | 2002246368 | A | 8/2002 |
| KR | 100147634 | * | 5/1998 |
| WO | WO9702589 | | 1/1997 |
| WO | WO 99/62099 | A1 | 2/1999 |
| WO | WO0150497 | | 7/2001 |

OTHER PUBLICATIONS

Official Action Dated May 19, 2010, Issued in Co-Pending U.S. Appl. No. 11/589,476.
Offical Action Dated May 27, 2010, Issued in Co-Pending U.S. Appl. No. 11/589,596.
Official Action Dated Jun. 22, 2010 Issued in Co-Pending U.S. Appl. No. 11/589,652.
Official Action Dated Jun. 23, 2010 Issued in Co-Pending U.S. Appl. No. 11/589,477.
U.S. Appl. No. 11/589,343, Richard Lewington et al., filed Oct. 30, 2006.
U.S. Appl. No. 11/589,598, Madhavi Chandrachood, Oct. 30, 2006.
U.S. Appl. No. 11/589,477, Madhavi Chandrachood, Oct. 30, 2006.
U.S. Appl. No. 11/589,337, Richard Lewington et al., Oct. 30, 2006.
U.S. Appl. No. 11/589,596, Richard Lewington et al., Oct. 30, 2006.
U.S. Appl. No. 11/589,476, Richard Lewington et al., Oct. 30, 2006.
U.S. Appl. No. 11/589,652, Richard Lewington et al., Oct. 30, 2006.
Official Communication Dated Oct. 30, 2009 in Co-Pending U.S. Appl. No. 11/589,343.
Official Communication Dated Sep. 21, 2009 in Co-Pending U.S. Appl. No. 11/589,598.
Official Communication Dated Sep. 24, 2009 in Co-Pending U.S. Appl. No. 11/589,577.
Official Communication Dated Jan. 6, 2010 Issued in Co-Pending U.S. Appl. No. 11/589,598.
Official Action Dated Dec. 7, 2010 Issued in Co-Pending U.S. Appl. No. 11/589,652.
Official Action Dated Dec. 8, 2010 Issued in Co-Pending U.S. Appl. No. 11/589,343.
Official Action Dated Dec. 9, 2010 Issued in Co-Pending U.S. Appl. No. 11/589,477.
Official Action Dated Dec. 10, 2010 Issued in Co-Pending U.S. Appl. No. 11/589,337.
Offical Action Dated Aug 4, 2010, Issued in Co-Pending U.S. Appl. No. 11/589,596.
Official Action Dated Apr. 23, 2010 Issued in Co-Pending U.S. Appl. No. 111589,476.
Official Action Dated Apr. 26, 2010 Issued in Co-Pending U.S. Appl. No. 11/589,343.
Official Action Dated Apr. 28, 2010 Issued in Co-Pending U.S. Appl. No. 11/589,337.
Official Action Dated Mar. 29, 2011 Issued in Co-Pending U.S. Appl. No. 11/589,598.
Official Action Dated Mar. 30, 2011 Issued in Co-Pending U.S. Appl. No. 11/589,478.
European Search Report Dated May 27, 2010 Issued in Corresponding European Patent Application No. 07014341.7-1226.
Official Communication Dated Aug. 31, 2009 in Co-Pending U.S. Appl. No. 11/589,652.

* cited by examiner

MASK ETCH PLASMA REACTOR WITH VARIABLE PROCESS GAS DISTRIBUTION

BACKGROUND OF THE INVENTION

Photolithographic mask fabrication for ultra large scale integrated (ULSI) circuits requires a much higher degree of etch uniformity than semiconductor wafer processing. A single mask pattern generally occupies a four inch square area on a quartz mask. The image of the mask pattern is focused down to the area of a single die (a one inch square) on the wafer and is then stepped across the wafer, forming a single image for each die. Prior to etching the mask pattern into the quartz mask, the mask pattern is written by a scanning electron beam, a time consuming process which renders the cost of a single mask extremely high. The mask etch process is not uniform across the surface of the mask. Moreover, the e-beam written photoresist pattern is itself non-uniform, and exhibits, in the case of 45 nm feature sizes on the wafer, as much as 2-3 nm variation in critical dimension (e.g., line width) across the entire mask. (This variation is the 3σ variance of all measured line widths, for example.) Such non-uniformities in photoresist critical dimension will vary among different mask sources or customers. The mask etch process cannot increase this variation by more than 1 nm, so that the variation in the etched mask pattern cannot exceed 3-4 nm. These stringent requirements arise from the use of diffraction effects in the quartz mask pattern to achieve sharp images on the wafer. It is difficult to meet such requirements with current technology. It will be even more difficult for future technologies, which may involve 22 nm wafer feature sizes. This difficulty is compounded by the phenomenon of etch bias, in which the depletion of the photoresist pattern during mask etch causes a reduction in line width (critical dimension) in the etched pattern on the quartz mask. These difficulties are inherent in the mask etch process because the etch selectivity of typical mask materials (e.g., quartz, chrome, molybdenum silicide) relative to photoresist is typically less than one, so that the mask photoresist pattern is etched during the mask etch process.

Some mask patterns require etching periodic openings into the quartz mask by a precisely defined depth that is critical to achieving the extremely fine phase alignment of interfering light beams during exposure of the wafer through the mask. For example, in one type of phase shift mask, each line is defined by a chrome line with thin quartz lines exposed on each side of the chrome line, the quartz line on one side only being etched to a precise depth that provides a 180 degree phase shift of the light relative to light passing through the un-etched quartz line. In order to precisely control the etch depth in the quartz, the etch process must be closely monitored by periodically interrupting it to measure the etch depth in the quartz. Each such inspection requires removing the mask from the mask etch reactor chamber, removing the photoresist, measuring the etch depth and then estimating the etch process time remaining to reach the target depth based upon the elapsed etch process time, depositing new photoresist, e-beam writing the mask pattern on the resist, re-introducing the mask into the mask etch chamber and restarting the etch process. The estimate of remaining etch time to reach the desired depth assumes that the etch rate remains stable and uniform, and therefore is unreliable. The problems of such a cumbersome procedure include low productivity and high cost as well as increased opportunity for contamination or faults in the photoresist pattern. However, because of the requirement for an accurately controlled etch depth, there has seemed to be no way around such problems.

The small tolerance in critical dimension variation requires extremely uniform distribution of etch rate over the mask surface. In masks requiring precise etch depth in the quartz material, there are two critical dimensions, one being the line width and the other being the etch depth, and uniformity for both types of critical dimension requiring a uniform etch rate distribution across the mask. Non-uniformity in etch rate distribution can be reduced to some extent by employing a source power applicator that can vary the radial distribution of the plasma ion density, such as an inductive source power applicator consisting of inner and outer coil antennas overlying the wafer. Such an approach, however, can only address non-uniformities that are symmetrical, that is a center-high or a center-low etch rate distribution. In practice, non-uniformities in etch rate distribution can be non-symmetrical, such as a high etch rate in one corner of the mask, for example. A more fundamental limitation is that the mask etch process tends to have such an extremely center-low distribution of etch rate that a tunable feature, such an inductive power applicator having inner and outer coils, is incapable of transforming the etch rate distribution out of the center-low regime.

Another problem with non-uniform etch rate distribution is that the etch rate distribution tends to vary widely among different reactors of the same design and can vary widely within the same reactor whenever a key part or a consumable component is replaced, such as replacement of the cathode. The etch rate distribution appears to be highly sensitive to small variations in features of the replaced part, with unpredictable changes upon consumable replacement.

SUMMARY OF THE INVENTION

A plasma reactor for processing a workpiece such as a mask or wafer includes a vacuum chamber having a cylindrical side wall, a ceiling overlying the side wall and a ring supported on a top edge of the side wall and supporting the ceiling, the ring comprising an external surface and an interior surface. An RF plasma source power applicator and an RF source power generator coupled to the applicator furnish plasma source power. Plural passages extend in a radial direction through the ring from the external surface to the interior surface and are spaced apart along a circumference of the ring. A process gas supply furnishes process gas. An external gas flow conduit apparatus outside of the chamber extends around a circumference of the chamber and is coupled to the process gas supply. Plural external gas flow valves outside of the chamber are coupled to the external conduit at respective locations spaced apart along the conduit, each of the valves having: (a) a controlled gas output port coupled to a respective one of the plural passages at the external surface of the ring and (b) a valve control input. A gas valve configuration controller controls the valve control input of each of the valves.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
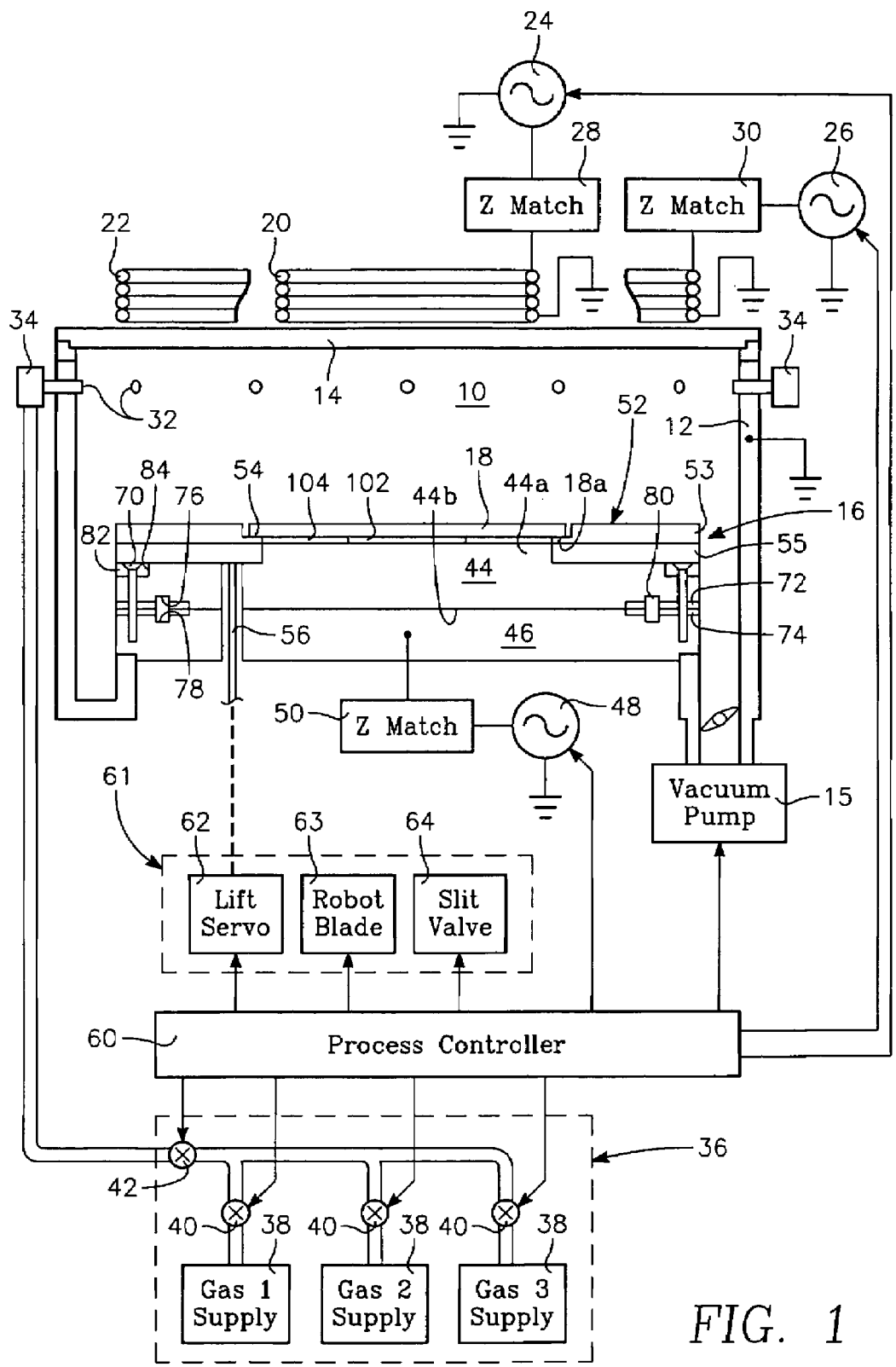
FIG. 1 depicts a plasma reactor for carrying out a mask etch process.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION OF THE INVENTION

Cathode with Enhanced RF Uniformity:

We have discovered that one source of non-uniform etch rate distribution in mask etch processes is the existence of RF electrical non-uniformities in the support pedestal or cathode holding the mask in the plasma reactor in which the mask etch process is carried out. RF bias power is applied to the pedestal to control plasma ion energy at the mask surface, while RF source power is applied to an overhead coil antenna, for example, to generate plasma ions. The RF bias power controls the electric field at the mask surface that affects the ion energy. Since the ion energy at the mask surface affects the etch rate, RF electrical non-uniformities in the pedestal create non-uniformities in the distribution of etch rate across the mask surface. We have discovered that there are several sources of RF non-uniformity in the pedestal. One is the titanium screws that fasten the aluminum pedestal (cathode) and aluminum facilities plate together. The screws create nodes in the electric field pattern across the surface of the pedestal (and therefore across the surface of the mask because their electrical properties differ from that of the aluminum cathode. Another is the non-uniform distribution of conductivity between the cathode and the facilities plate. Electrical conduction between the facilities plate and the cathode is confined primarily to the perimeter of the plate and cathode. This can be due at least in part to bowing of the cathode during plasma processing induced by vacuum pressure. The conduction around this perimeter can be non-uniform due to a number of factors, such as uneven tightening of the titanium screws and/or surface finish variations around the perimeter of either the plate or the pedestal. We have solved these problems by the introduction of several features that enhance RF electrical uniformity across the pedestal. First, the non-uniformities or discontinuities in the RF field arising from the presence of the titanium screws in the aluminum cathode are addressed by providing a continuous titanium ring extending around the perimeter of the top surface of the cathode that encompasses the heads of all the titanium screws. Variations in conductivity due surface differences or uneven tightening of the titanium screws are addressed by providing highly conductive nickel plating on the facing perimeter surfaces of the facilities plate and the cathode, and by the introduction of an RF gasket between the facilities plate and the cathode that is compressed between them at their perimeter.

Referring to FIG. 1, a plasma reactor for etching patterns in a mask includes a vacuum chamber 10 enclosed by a side wall 12 and an overlying ceiling 14 and is evacuated by a vacuum pump 15 that controls chamber pressure. A mask support pedestal 16 inside the chamber 10 supports a mask 18. As will be described later in this specification, the mask typically consists of a quartz substrate and can further include additional mask thin film layers on the top surface of the quartz substrate, such as chrome and molybdenum silicide. In addition, a pattern-defining layer is present, which may be photoresist or a hardmask formed of the chrome layer. In other types of masks, the quartz substrate has no overlying layers except for the photoresist pattern.

Plasma source power is applied by overlying inner and outer coil antennas 20, 22 driven by respective RF source power generators 24, 26 through respective RF impedance match circuits 28, 30. While the sidewall 12 may be aluminum or other metal coupled to ground, the ceiling 14 is typically an insulating material that permits inductive coupling of RF power from the coil antennas 20, 22 into the chamber 10. Process gas is introduced through evenly spaced injection nozzles 32 in the top of the side wall 12 through a gas manifold 34 from a gas panel 36. The gas panel 36 may consist of different gas supplies 38 coupled through respective valves or mass flow controllers 40 to an output valve or mass flow controller 42 coupled to the manifold 34.

Figure 7:
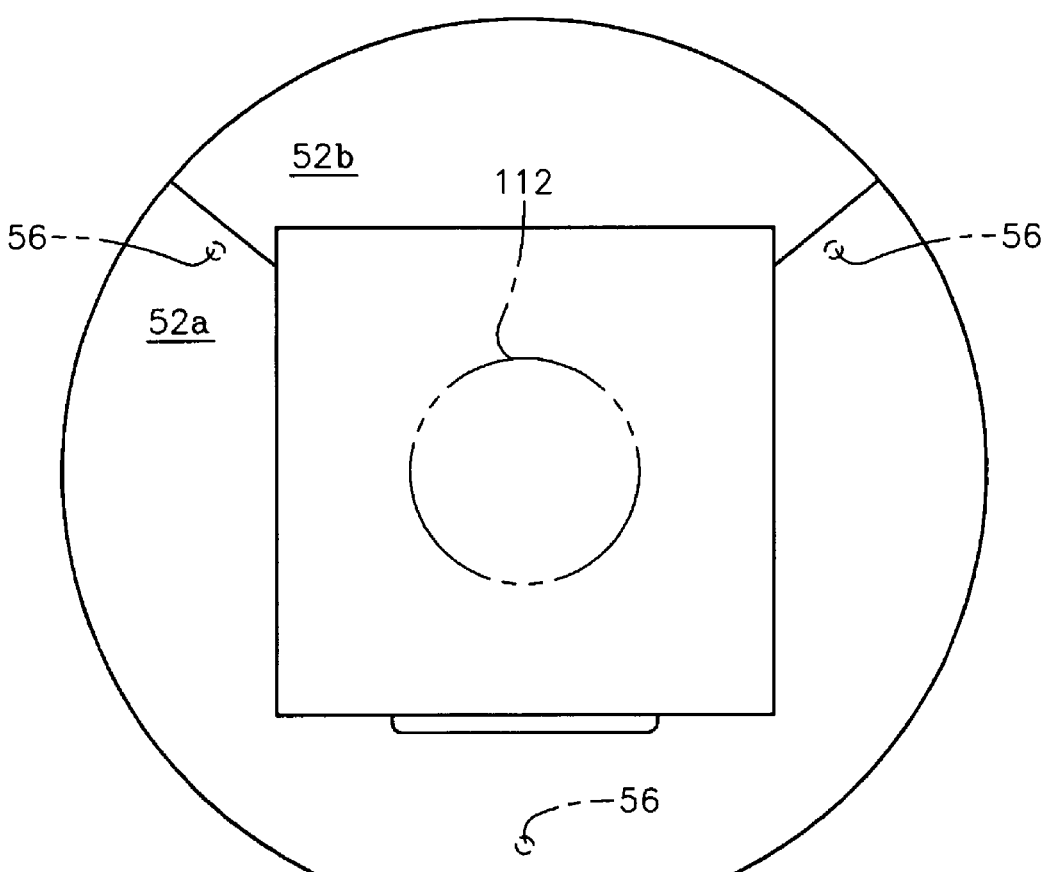

The mask support pedestal 16 consists of a metal (e.g., aluminum) cathode 44 supported on a metal (e.g., aluminum) facilities plate 46. The cathode 44 has internal coolant or heating fluid flow passages (not shown) that are fed and evacuated by supply and drain ports (not shown) in the facilities plate 46. RF bias power is applied to the facilities plate by an RF bias power generator 48 through an RF impedance match circuit 50. The RF bias power is conducted across the interface between the facilities plate 46 and the cathode 44 to the top surface of the cathode 44. The cathode 44 has a central plateau 44a upon which the square quartz mask or substrate 18 is supported. The plateau dimensions generally match the dimensions of the mask 18, although the plateau 44a is slightly smaller so that a small portion or lip 18a of the mask perimeter extends a short distance beyond the plateau 44a, as will be discussed below. A pedestal ring 52 surrounding the plateau 44a is divided (in wedge or pie section fashion as shown in FIG. 2B or FIG. 7) into a cover ring 52a forming about two-fifths of the ring 52 and a capture ring 52b forming the remaining three-fifths of the ring 52. The capture ring 52b has a shelf 54 in which the lip 18a of the mask 18 rests. Three lifts pins 56 (only one of which is visible in the view of FIG. 1) lift the capture ring 52b, which raises the mask 18 by the lip 18a whenever it is desired to remove the mask 18 from the support pedestal 16. The pedestal ring 52 consists of layers 53, 55 of materials of different electrical characteristics selected to match the RF impedance presented by the combination of the quartz mask 18 and the aluminum plateau 44a, at the frequency of the bias power generator 48. (Both the cover and capture rings 52a, 52b consist of the different layers 53, 55.) Moreover, the top surface of the capture ring 52 is coplanar with the top surface of the mask 18, so that a large uniform surface extending beyond the edge of the mask 18 promotes a uniform electric field and sheath voltage across the surface of the mask 18 during plasma processing. Typically, these conditions are met if the lower ring layer 55 is quartz and the upper ring layer 53 is a ceramic such as alumina. A process controller 60 controls the gas panel 36, the RF generators 24, 26, 48, and wafer handling apparatus 61. The wafer handing apparatus can include a lift servo 62 coupled to the lift pins 56, a robot blade arm 63 and a slit valve 64 in the side wall 12 of the chamber 10.

A series of evenly spaced titanium screws 70 fasten the cathode 44 and facilities plate 46 together along their perimeters. Because of the electrical dissimilarities between the aluminum cathode/facilities plate 44, 46 and the titanium screws 70, the screws 70 introduce discrete non-uniformities into the RF electrical field at the top surface of the cathode 44. Variations in the opposing surfaces of the cathode 44 and facilities plate 46 create non-uniformities in the conductivity between the cathode 44 and facilities plate 46 along their perimeter, which introduces corresponding non-uniformities in the RF electrical field. Because the cathode 44 tends to bow up at its center during plasma processing (due to the chamber vacuum), the principal electrical contact between the cathode 44 and the facilities plate 46 is along their perimeters. In order to reduce the sensitivity of the electrical conductivity between the cathode 44 and facilities plate 46 to (a) variations in tightness among the various titanium screws 70 and (b) variations in surface characteristics, an annular thin film 72 of a highly conductive material such as nickel is deposited on the perimeter of the bottom surface 44b of the cathode 44, while a matching annular thin film 74 of nickel (for example) is deposited on the perimeter of the top surface 46a of the facilities plate 46. The nickel films 72, 72 are in mutual alignment, so that the two annular nickel thin films 72, 74 constitute the opposing contacting surfaces of the pedestal 44 and facilities plate 46, providing a highly uniform distribution of electrical conductivity between them. Further improvement in uniform electrical conductivity is realized by providing an annular groove 76 along the perimeter of the bottom surface of the cathode 44 and placing a conductive RF gasket 80 within the groove 76. Optionally, a similar annular groove 78 in the top surface of the facilities plate 46 may be provided that is aligned with the groove 76. The RF gasket 80 may be of a suitable conventional variety, such as a thin metal helix that is compressed as the cathode 44 and facilities plate 46 are pressed together and the screws 70 tightened. In order to reduce or eliminate the point non-uniformities in electrical field distribution tending to occur at the heads of the titanium screws 70, a continuous titanium ring 82 is placed in an annular groove 84 in the perimeter of the top surface of the cathode 44.

Figure 2A:
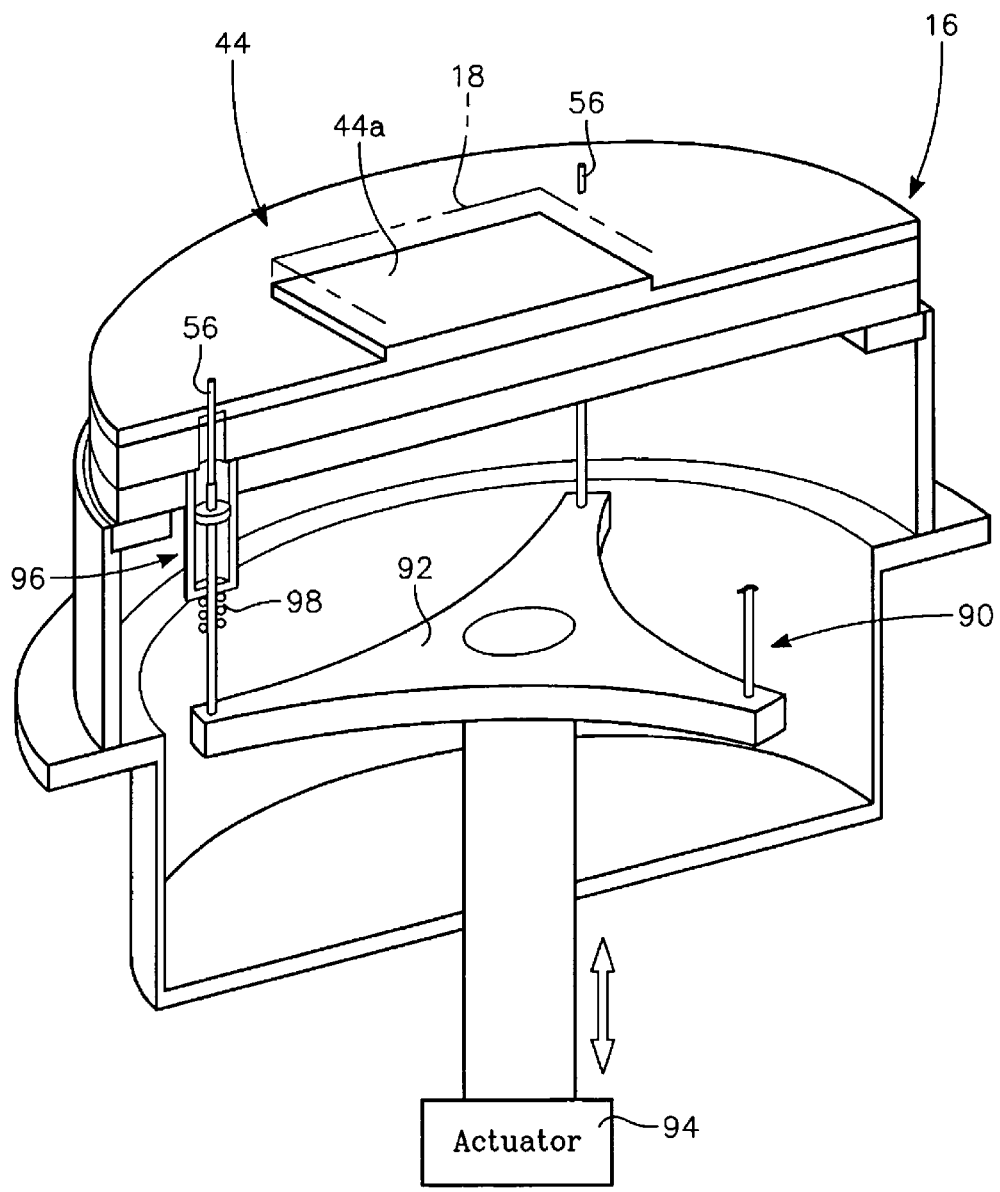
FIG. 2A depicts a lower portion of the reactor of FIG. 1.
Figure 2B:
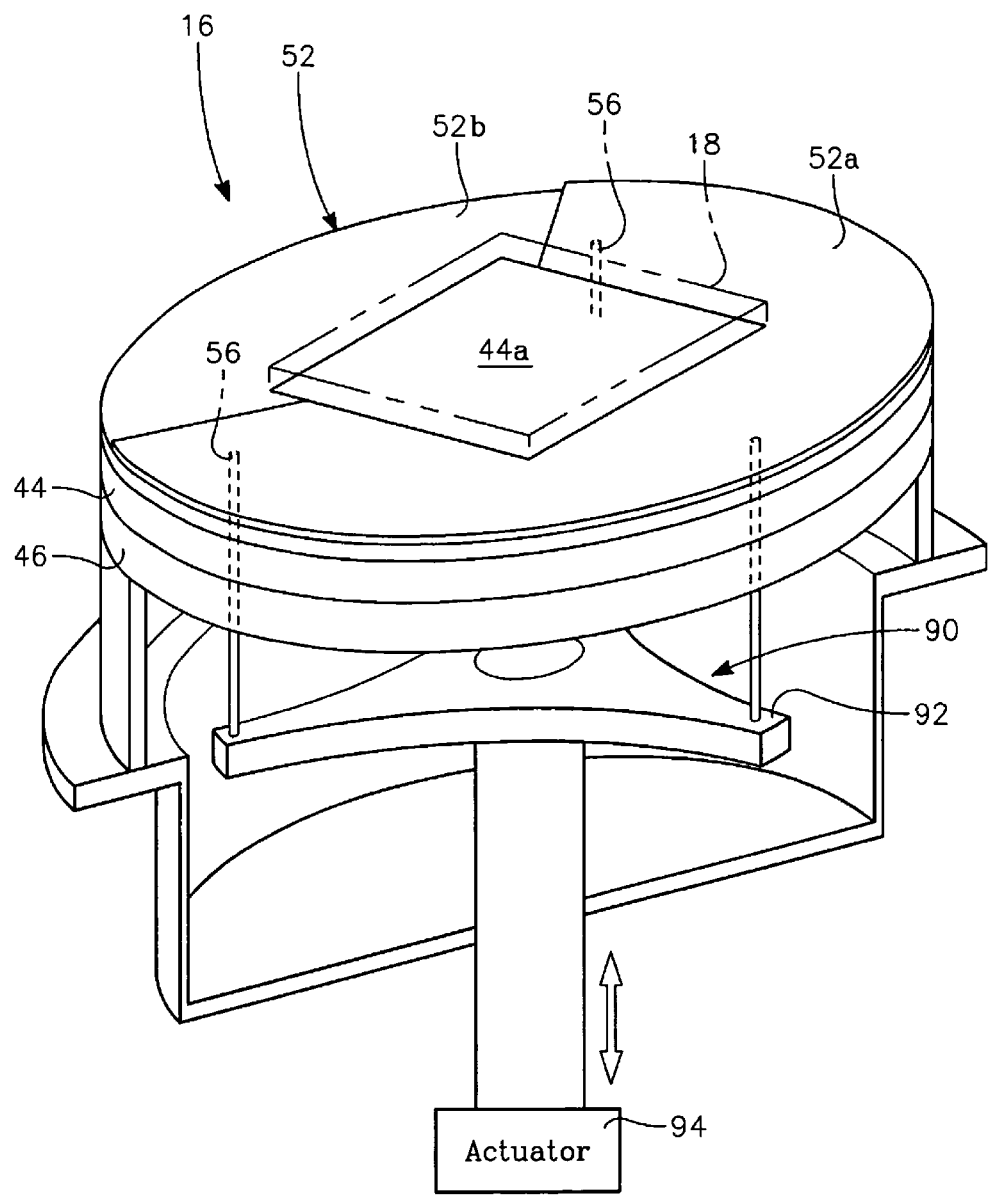
FIG. 2B illustrates a mask support pedestal of the reactor of FIG. 1 in a raised position.

FIG. 2A depicts the mask support pedestal 16 and its underlying lift assembly 90. The lift assembly 90 includes a lift spider 92 driven by a pneumatic actuator or lift servo 94 and the three lift pins 56 resting on the lift spider 92. The lift pins 56 are guided in lift bellows 96 that include ball bearings 98 for extremely smooth and nearly frictionless motion (to reduce contamination arising from wear). FIG. 2B depicts the cathode 44 with the capture ring 52b and mask 18 in the raised position. The void formed by separation of the cover and capture rings 52a, 52b when the mask is raised permits access by a robot blade to the mask 18.

Figure 3:
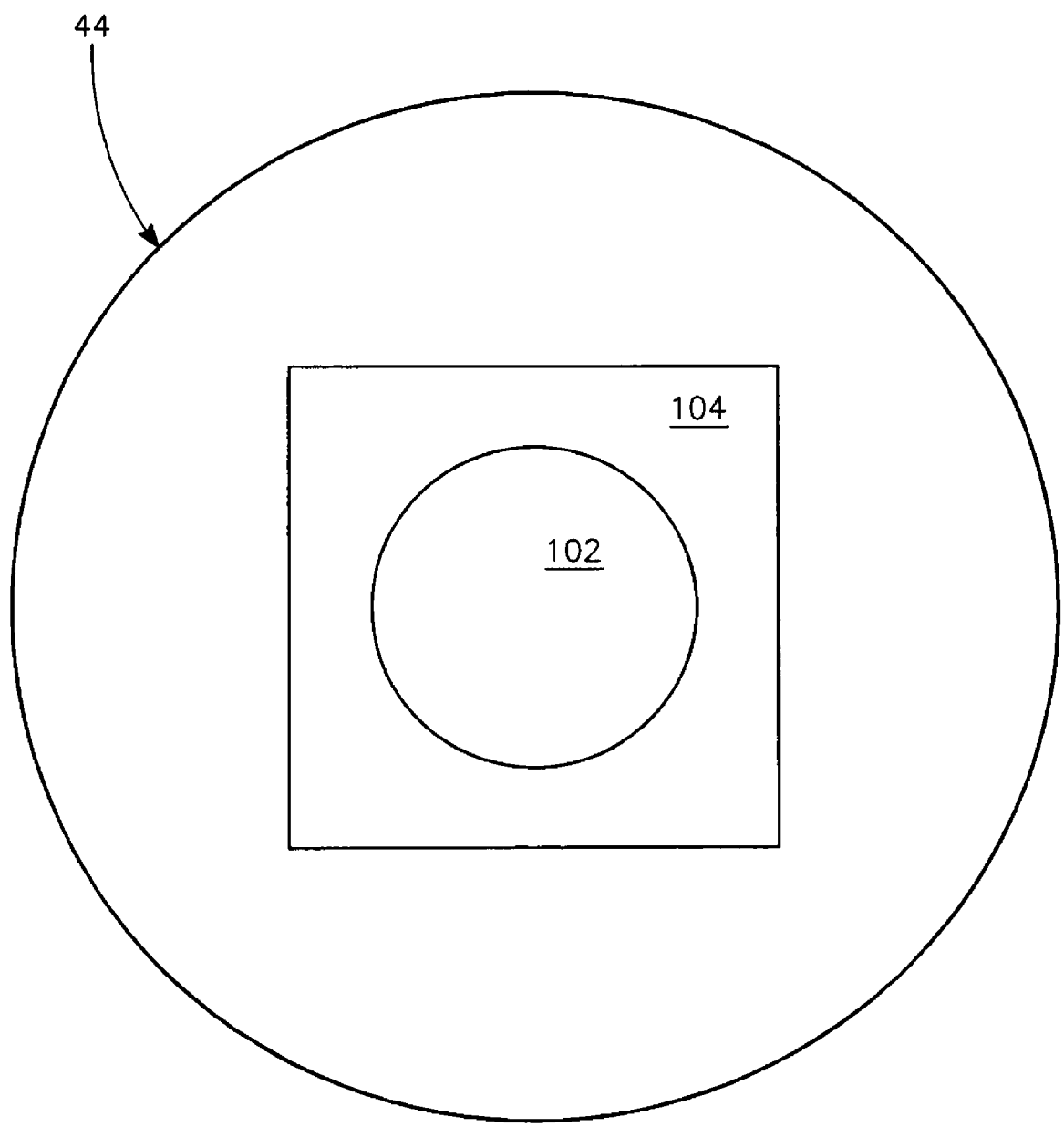
FIG. 3 is a top view of a cathode of the reactor of FIG. 1.
Figure 4:
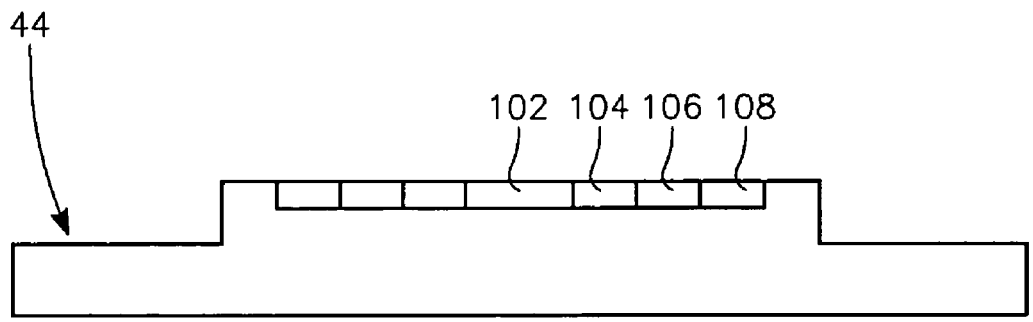
FIGS. 4 and 5 are top and side views of one alternative embodiment of the cathode.
Figure 5:
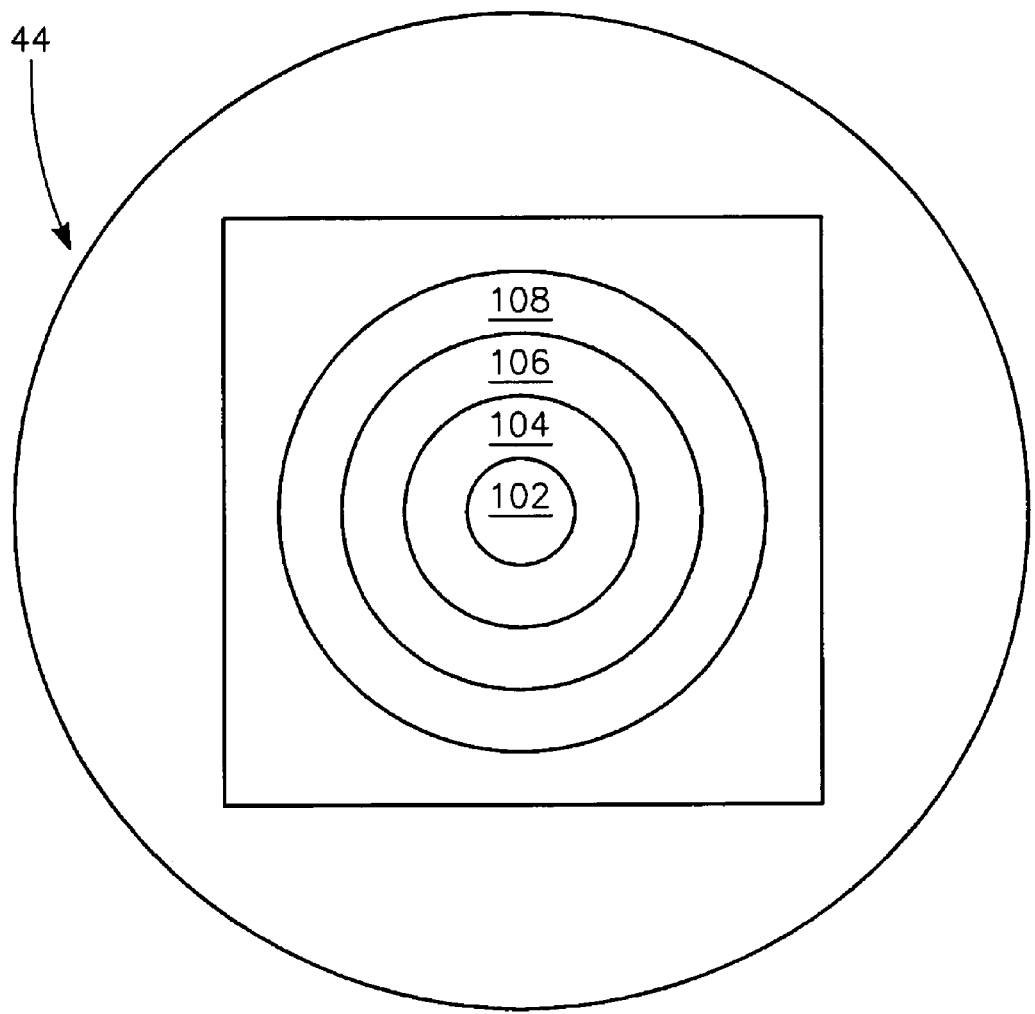
Figure 6:
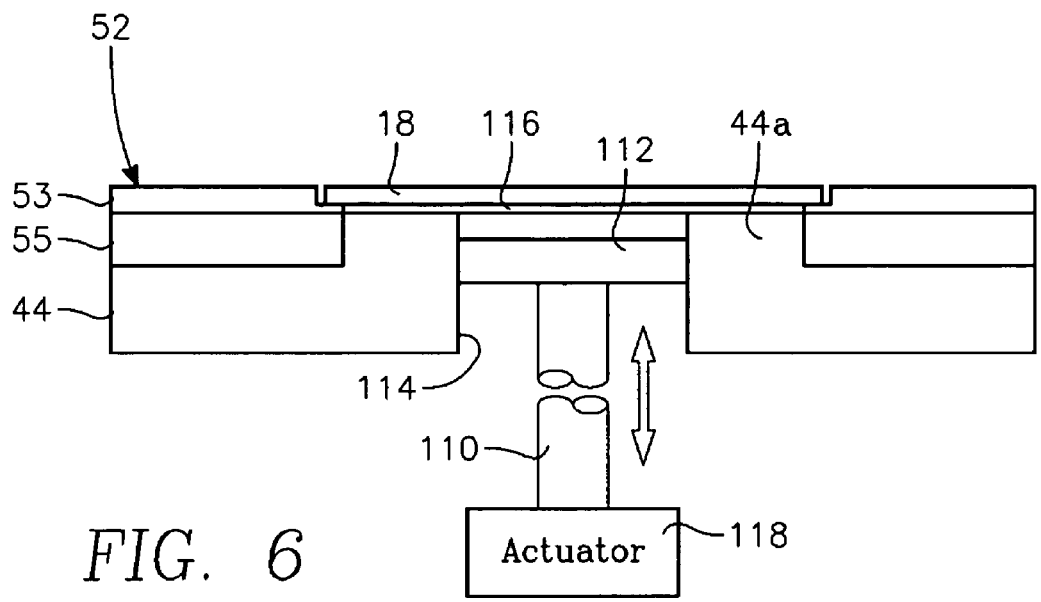
FIGS. 6 and 7 are top and side views of another alternative embodiment of the cathode.

The problem of an extremely center-low etch rate distribution across the surface of the mask 18 is solved by altering the distribution of the electrical properties (e.g., electrical permittivity) of the cathode plateau 44a. This is achieved in one embodiment by providing, on the top surface of the plateau 44a, a center insert 102 and a surrounding outer insert 104, the two inserts forming a continuous planar surface with the pedestal ring 52 and being of electrically different materials. For example, in order to reduce the tendency of the etch rate distribution to be extremely center-low, the center insert 102 may be of a conductive material (e.g., aluminum) while the outer insert 104 may be of an insulating material (e.g., a ceramic such as alumina). This conductive version of the center insert 102 provides a much lower impedance path for the RF current, boosting the ion energy and etch rate at the center of the mask 18, while the insulating outer insert 104 presents a higher impedance, which reduces the etch rate at the periphery of the mask 18. This combination improves the etch rate distribution, rendering it more nearly uniform. With this feature, fine tuning of the etch rate distribution can be performed by adjusting the relative RF power levels applied to the inner and outer coil antennas 20, 22. The change in radial distribution of plasma ion density required to achieve uniform etch rate distribution is reduced to a much smaller amount which is within the capability of RF power apportionment between the inner and outer coils 20, 22 to attain uniform etch rate distribution. FIG. 3 is a top view of the inner and outer inserts 102, 104. In an alternative embodiment, the inserts 102, 104 may be insulators having different dielectric constants (electrical permittivities). FIGS. 4 and 5 depict an elaboration upon this concept, in which four concentric rings 102, 104, 106, 108 of progressively different electrical properties are employed to render the etch rate distribution more uniform. FIGS. 6 and 7 depict an alternative embodiment that provides real-time tunability of distribution of RF electrical properties of the cathode 44. A plunger 110 controls the axial position of a movable aluminum plate 112 within a hollow cylinder 114 in the center interior of the cathode 44. The aluminum plate 112 is in electrical contact with the remainder of the aluminum plateau 44a. An insulator (e.g., ceramic) top film 116 can cover the top of the cathode 44. As the aluminum plate 112 is pushed closer to the top of the cylinder 114, the electrical impedance through the center region of the cathode 44 is reduced, thereby raising the etch rate at the center of the mask 18. Conversely, the etch rate at the mask center is reduced as the aluminum plate 112 is moved downward in the cylinder 114 away from the mask 18. An actuator 118 controlling axial movement of the plunger 110 can be governed by the process controller 60 (FIG. 1) to adjust the etch rate distribution to maximize uniformity or compensate for non-uniformities.

Etch Rate Monitoring and End Point Detection Through the Mask Backside:

The high production cost of periodic interruptions of the etch process to measure the etch depth or critical dimension on the mask is reduced or eliminated using optical sensing through the cathode 44 and through the backside of the mask or substrate 18. It has been necessary to interrupt the etch process to perform such periodic measurements because of the poor etch selectivity relative to photoresist: in general, the mask materials etch more slowly than the photoresist. This problem is typically addressed by depositing a thick layer of photoresist on the mask, but the high rate of etching of the resist renders the photoresist surface randomly uneven or rough. This roughness affects light passing through the photoresist and so introduces noise into any optical measurement of critical dimension or etch depth. Therefore, the photoresist is temporarily removed for each periodic measurement to ensure noise-free optical measurements, necessitating re-deposition of photoresist and re-writing of the reticle pattern into the photoresist before re-starting the interrupted mask etch process.

Figure 8:
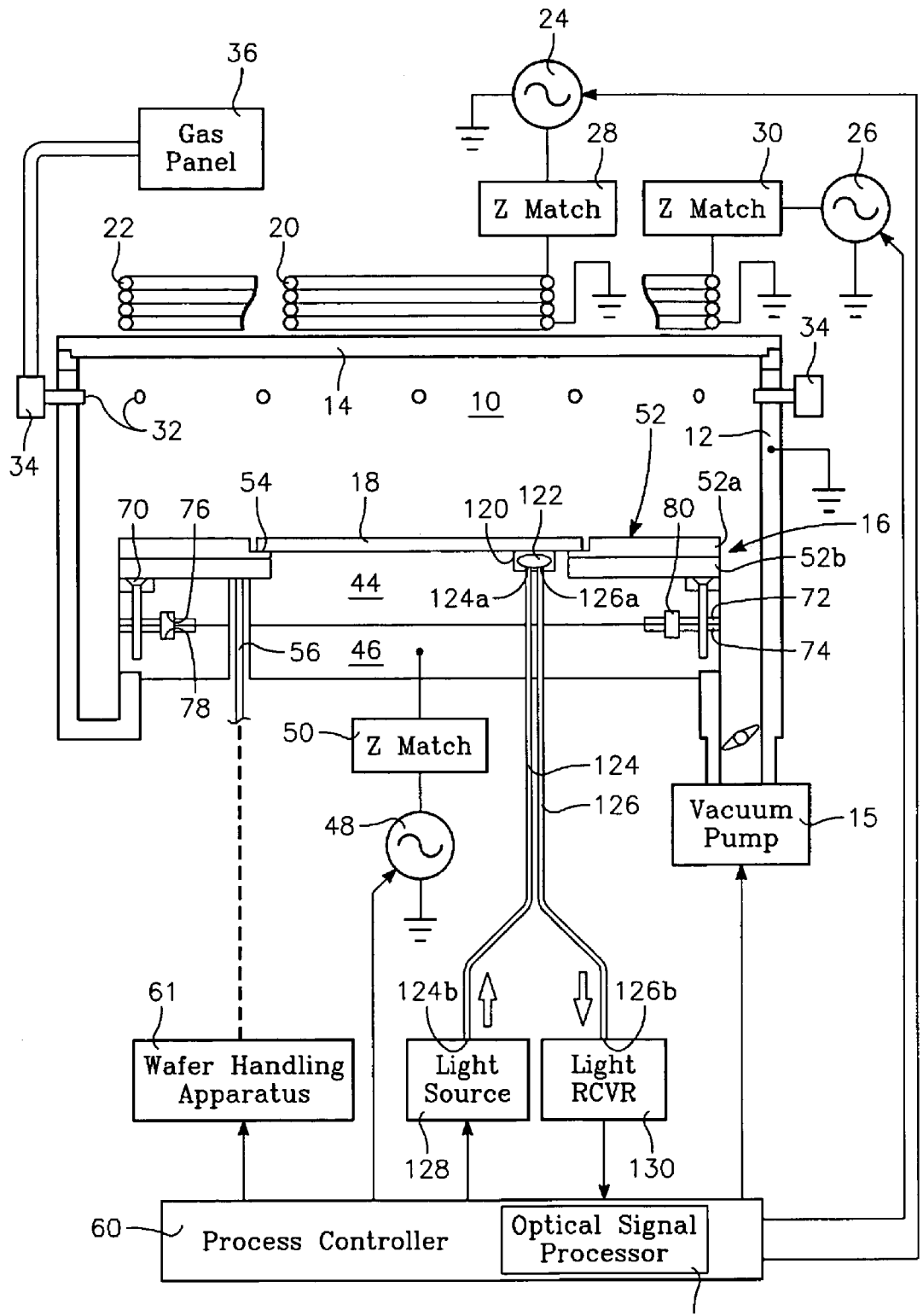
FIG. 8 is a simplified diagram of a plasma reactor having a backside end point detection apparatus.

The mask etch plasma reactor depicted in FIG. 8 avoids these difficulties and permits continuous observation of critical dimensions or measurement of etch depth during the entire etch process while the mask or substrate 18 is left in place on the mask support pedestal 16 using backside optical measurement apparatus provided within the cathode 44. The backside measurement apparatus takes advantage of the optically transparent nature of the mask substrate 18, which is typically quartz. The thin films that may be deposited over it (such as chrome or molybdenum silicide) may be opaque, but the formation of patterned openings defining the reticle pattern of the mask 18 can be sensed optically. The change in light intensity reflected by such layers or transmitted through such layers may be observed at the mask back side through the cathode 44. This observation may be used to perform etch process end point detection. When etching the quartz material, optical interference observed at the mask back side through the cathode 44 may be sensed to perform etch depth measurements in real time during the etch process. One advantage is that the images or light signals sensed from the mask backside are not affected by photoresist noise, or at least are affected very little compared with attempts to perform such measurements from the top surface (photoresist side) of the mask 18.

For these purposes, the reactor of FIG. 8 includes a recess 120 within the top surface of the cathode 44 that accommodates a lens 122 whose optical axis faces the backside of the mask or substrate 18. A pair of optical fibers 124, 126, whose diameters are small relative to the lens 122, have ends 124a, 126a close to or contacting the lens 122 and both are aligned next to each other at the optical axis of the lens 122. Each of the optical fibers 124, 126 depicted in FIG. 8 may actually be a small bundle of optical fibers. The optical fiber 124 has its other end 124b coupled to a light source 128. The light source emits light of a wavelength at which the mask 18 is transparent, typically visible wavelengths for a quartz mask. In the case of interference depth measurements, the wavelength spectrum of the light source 128 is selected to facilitate local coherence in the reticle pattern of the mask 18. For periodic features in the etched mask structure on the order of about 45 nm (or periodic feature sizes below one micron), this requirement is met if the light source 128 radiates in the visible light spectrum. The optical fiber 126 has its other end 126b coupled to a light receiver 130. In the case of simple end point detection, the light receiver 130 may simply detect light intensity. In the case of critical dimension (e.g., line width) measurements, the light receiver 130 may sense the image of etched lines within the field of view of the lens 122, from which the line width can be determined. In the case of etch depth measurements, the light receiver 130 may detect an interference pattern or interference fringes, from which the etch depth may be determined (i.e., inferred from the interference or diffraction pattern or computed from the counting of interference fringes). In other embodiments, the light receiver 130 may include a spectrometer for performing multiple wavelength interference measurements, from which etch depth may be inferred or computed. For such determinations, the process controller 60 includes an optical signal processor 132 capable of processing the optical signal from the light receiver. Such optical signal processing may involve (depending upon the particular implementation) one of the following: performing etch process end point detection from ambient light intensity changes; measuring critical dimensions from two-dimensional images sensed by the optical receiver 130; computing etch depth by counting interference fringes; determining etch depth from the multiple wavelength interference spectrum, in which case the optical receiver 130 consists of a spectrometer. Alternatively, such a spectrometer may be employed to perform etch process end point detection by optical emission spectrometry from the wafer backside, using light emitted by the plasma and transmitted through the transparent mask 18, in which case the light source 128 is not employed.

The process controller 60 reacts to the process end point detection information (or the etch depth measurement information) from the optical signal processor 132 to control various elements of the plasma reactor, including the RF generators 24, 26, 48 and the wafer-handling apparatus 61. Typically, the process controller 60 stops the etch process and causes removal the mask 18 from the pedestal 16 when the etch process end point is reached.

Figure 9:
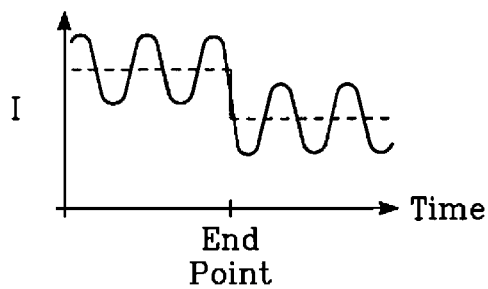
FIGS. 9 and 10 are graphs of an optical end point detection signal obtained from the front side and back side, respectively, of the mask.
Figure 10:
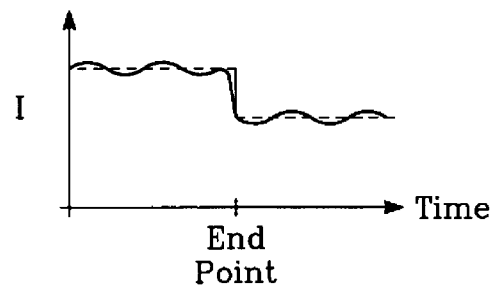

FIG. 9 is a graph depicting ambient reflected light intensity sensed from the top (photoresist-coated) side of the mask as a function of time during a chrome etch process (in which a chrome thin film on the quartz mask surface is etched in accordance with a mask reticle pattern). The large swings in intensity depicted in the graph of FIG. 9 represent noise induced by roughness in the top surface of the photoresist layer. The dashed line represents a step function signal hidden within the noise, the step function coinciding with the chrome etch process end point. FIG. 10 is a graph of the same measurement taken from the wafer backside through the cathode 44 in the reactor of FIG. 8, in which the light receiver 130 senses the reflected light level. The photoresist-induced noise is greatly reduced, so that the end-point defining step function is clearly represented in the optical data. The edge of the step function depicts a transition point at which reflected light intensity drops upon the etch process reaching the bottom of the chrome thin film, at which point the reflective surface area of the chrome is abruptly reduced.

Figure 11:
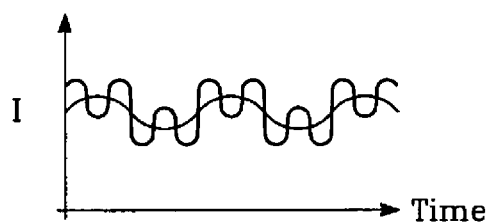
FIGS. 11 and 12 are graphs of an interference fringe optical signal obtained from the front side and back side, respectively, of the mask.
Figure 12:
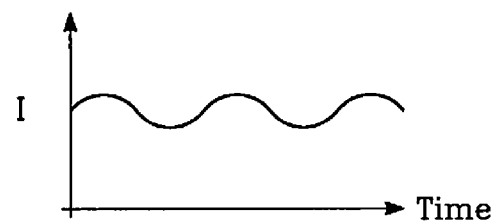

FIGS. 11 and 12 are graphs of light intensity over time (or, equivalently, over space), and, in FIG. 12, as sensed by the optical receiver 130, in which the periodic peaks in light intensity correspond to interference fringes whose spacing determines the etch depth, or difference in thickness between different surfaces of closely periodically spaced features etched in the transparent quartz mask substrate 18. FIG. 11 depicts the intensity sensed through the photoresist from the top side of the mask, with a heavy photoresist-induced noise component that impairs interference fringe detection. FIG. 12 depicts the intensity sensed through the mask backside by the optical receiver 130 of FIG. 8, in which photoresist-induced noise is virtually absent.

Figure 13:
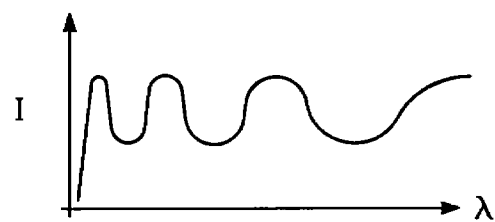
FIG. 13 is a graph of a multiple wavelength interference spectrum signal obtained in one embodiment of the reactor of FIG. 8.

FIG. 13 is a graph representing light intensity as a function of wavelength for the case in which the light receiver 130 consists of a spectrometer and the light source 128 produces a spectrum of wavelengths. The behavior of the intensity spectrum of the graph of FIG. 13 is typical of a situation in which interference effects occur between light reflected from surfaces of different depths in sub-micron features that are periodically spaced in the transparent mask 18. At the lower wavelengths, the peaks are fairly periodic and even spaced, the predominant optical effect being interference. At the higher wavelengths, local coherence among the periodic features in the mask 18 is not as strong, so that diffraction effects become increasingly significant with increasing wavelength, causing the intensity behavior at the higher wavelengths to be less evenly spaced and more complex, as depicted in FIG. 13. The spacing of the peaks in FIG. 13, particularly at the lower wavelengths, is a function of the etch depth, which may be inferred from the peak-to-peak spacing.

Figure 14:
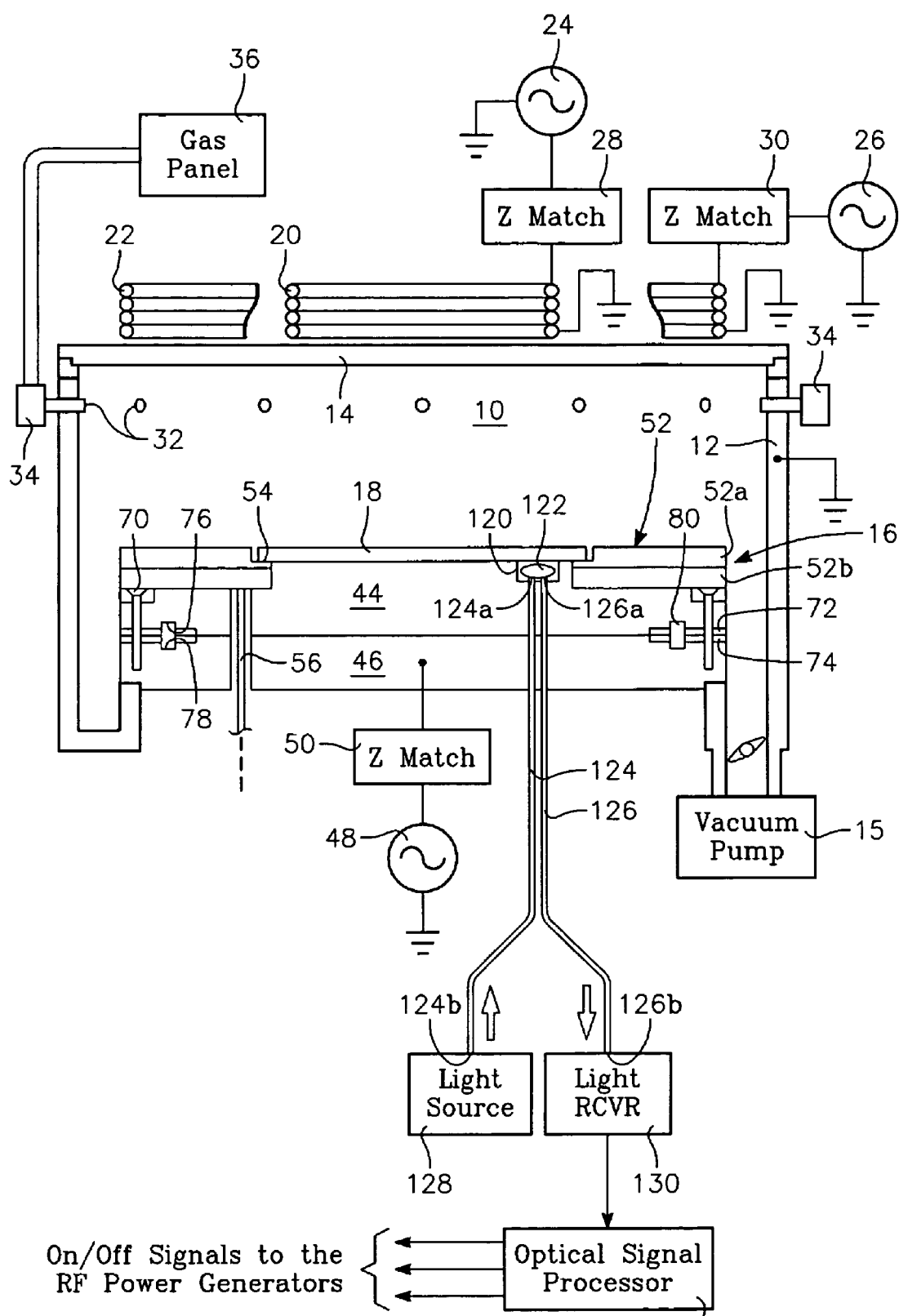
FIG. 14 illustrates an embodiment of the reactor of FIG. 8 with backside end point detection based upon overall reflected light intensity, corresponding to FIG. 10.

FIG. 14 illustrates an embodiment of the reactor of FIG. 8, in which the light receiver 130 is an ambient light intensity detector and the optical signal processor 132 is programmed to look for a large inflection (step function) in the overall reflected light intensity, corresponding to the end point detection graph of FIG. 10. The light source 128 in this embodiment can be any suitable light source. Alternatively, the light source 128 can be eliminated, so that the light sensor 130 simply responds to light from the plasma transmitted through the transparent mask or substrate 18.

Figure 15:
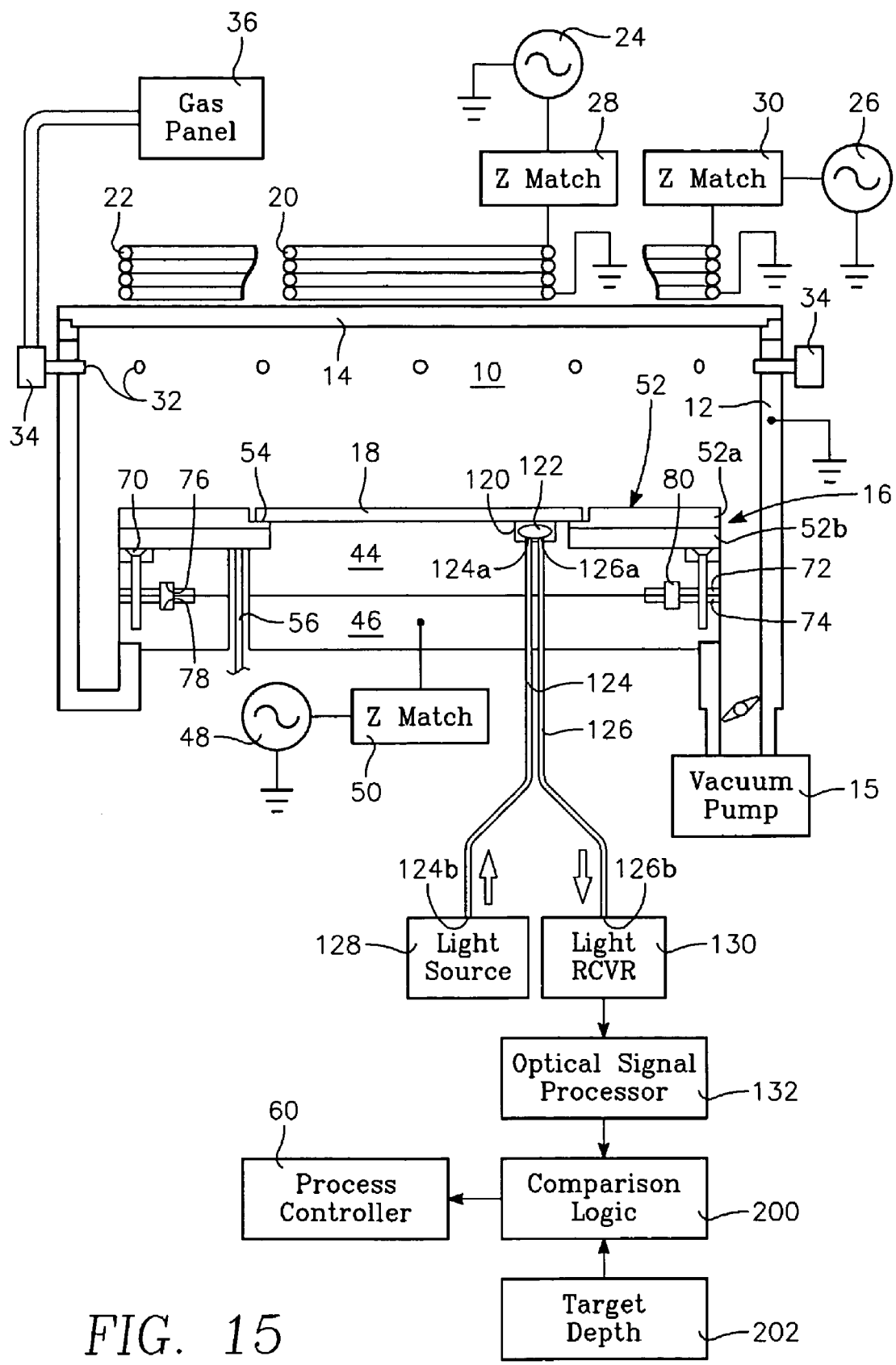
FIG. 15 illustrates an embodiment of the reactor of FIG. 8 with backside endpoint detection based upon interference fringe counting, corresponding to FIG. 12.

FIG. 15 illustrates an embodiment of the reactor of FIG. 8 in which the light receiver 130 is an interference fringe detector sufficiently focused by the lens 122 to resolve interference fringes, and the optical signal processor 132 is programmed to count interference fringes (e.g., from intensity versus time data of the type illustrated in FIG. 12) in order to compute etch depth in the transparent quartz mask 18. This computation yields a virtually instantaneous etch depth, which is compared by logic 200 with a user-defined target depth stored in a memory 202. The logic 200 can use a conventional numerical match or minimization routine to detect a match between the stored and measured depth values. A match causes the logic 200 to flag the etch end point to the process controller 60.

Figure 16:
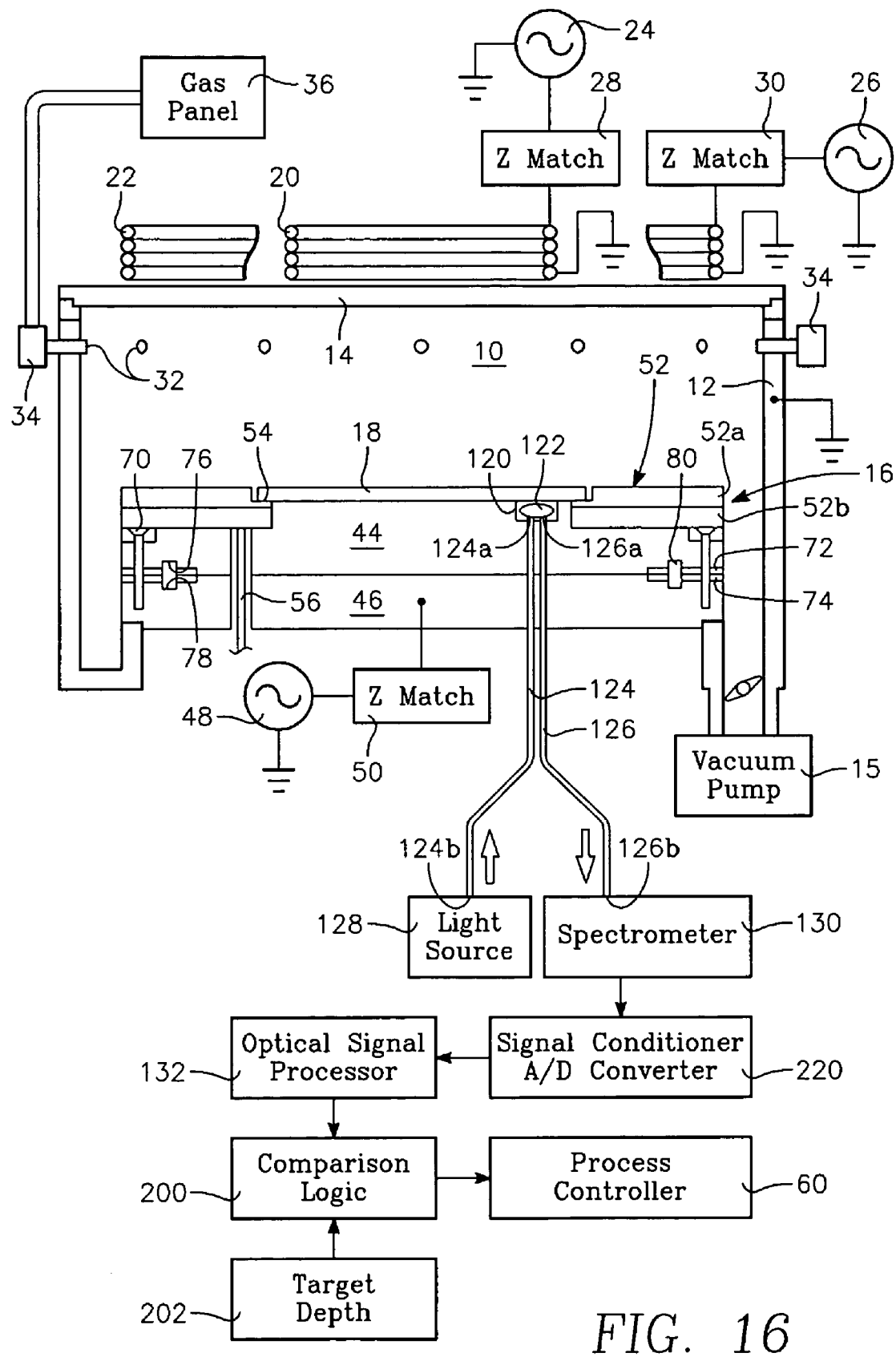
FIG. 16 illustrates an embodiment of the reactor of FIG. 8 with backside endpoint detection based upon multiple wavelength interference spectrometry.

FIG. 16 illustrates an embodiment of the reactor of FIG. 8 which employs the interference spectroscopy technique of FIG. 13 to measure or determine etch depth in the transparent quartz mask or substrate 18. In this case, the light source 128 emits multiple wavelengths or a spectrum in the visible range (for periodic mask feature sizes on the order of hundreds of nanometers or less). The light receiver 130 is a spectrometer. A combination signal conditioner and analog-to-digital converter 220 converts the spectrum information collected by the spectrometer 130 (corresponding to the graph of FIG. 13) into digital data which the optical signal processor 132 can handle. One mode in which end point detection can be performed is to compute the etch depth from the spacing between the periodic peaks in the lower wavelength range of the data represented by FIG. 13, as mentioned above. Comparison logic 200 can compare the instantaneous measured etch depth to a user-defined target depth stored in memory 202 to determine whether the etch process end point has been reached. In another mode, the comparison logic 200 is sufficiently robust to compare the digitally represented wavelength spectrum (corresponding to the graph of FIG. 13) representing the instantaneous output of the spectrometer 130 with a known spectrum corresponding with the desired etch depth. This known spectrum may be stored in the memory 202. A match between the measured spectrum and the stored spectrum, or an approximate match, detected by the comparison logic 200 results in an etch process end point flag being sent to the process controller 60.

Figure 17:
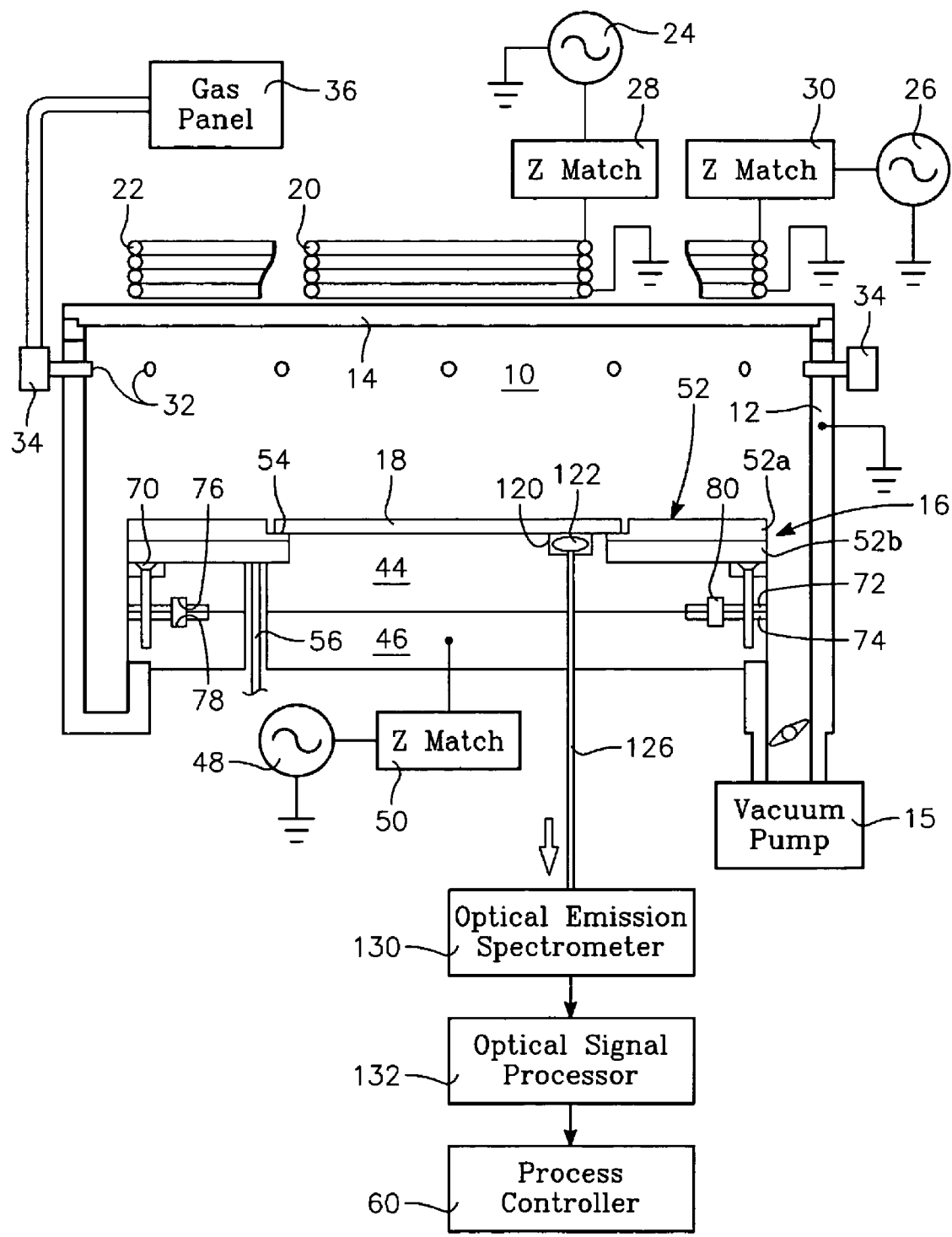
FIG. 17 illustrates an embodiment of the reactor of FIG. 8 with backside endpoint detection based upon optical emission spectrometry (OES).

FIG. 17 illustrates an embodiment of the reactor of FIG. 8 in which the optical receiver 130 is an optical emission spectrometer capable of differentiating emission lines from optical radiation emitted by the plasma in the chamber, to perform optical emission spectrometry (OES). The processor 132 is an OES processor that is programmed to track the strength (or detect the disappearance) of selected optical lines corresponding to chemical species indicative of the material in the layer being etched. Upon the predetermined transition (e.g., the disappearance of a chrome wavelength line in the OES spectrum during a chrome etch process), the processor 132 sends an etch process end point detection flag to the process controller 60.

Figure 18:
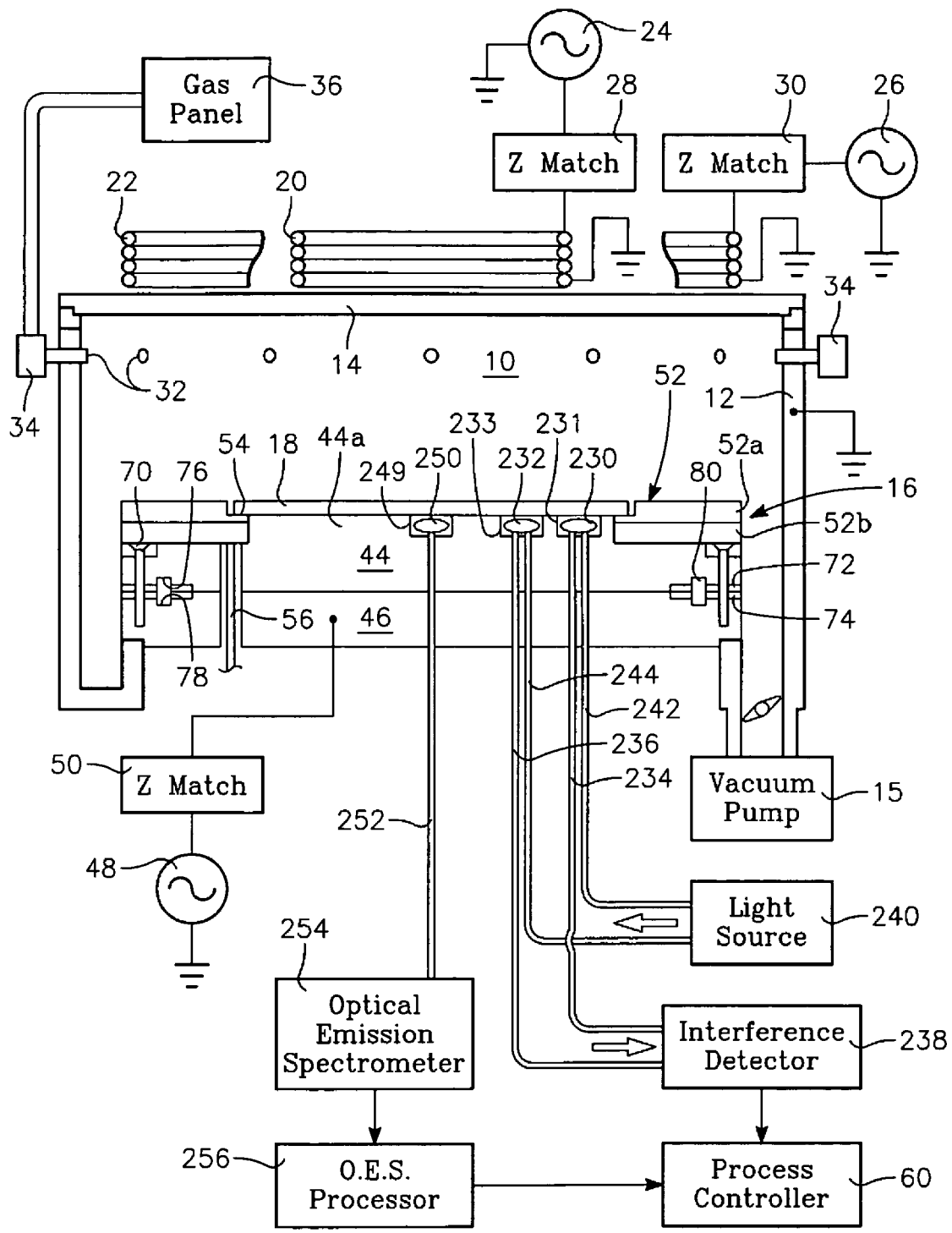
FIG. 18 illustrates a working example having both OES and interference-based backside endpoint detection.
Figure 19:
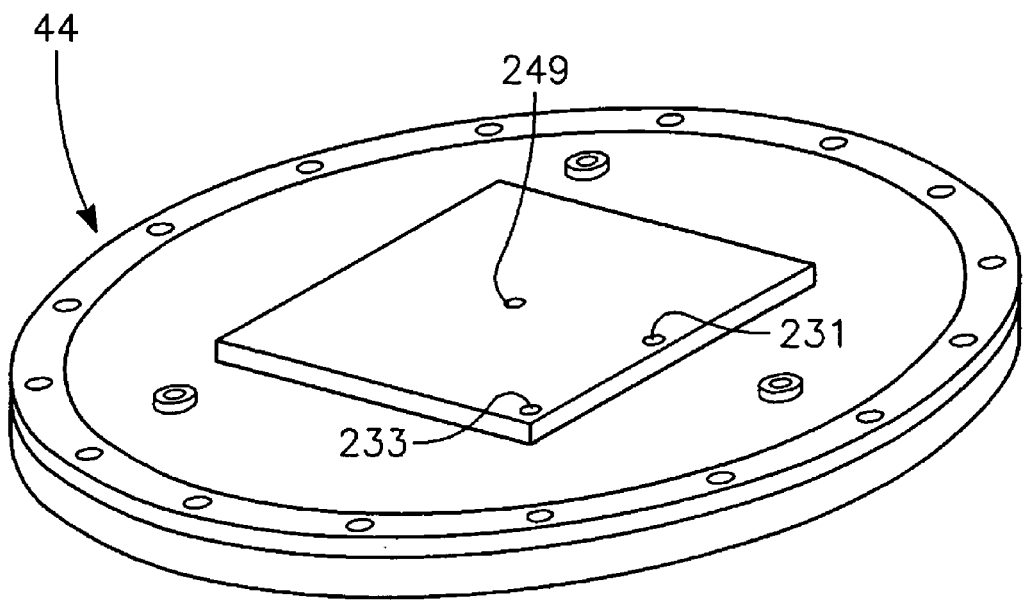
FIGS. 19 and 20 are perspective view of the cathode and facilities plate, respectively, of the embodiment of FIG. 18.
Figure 20:
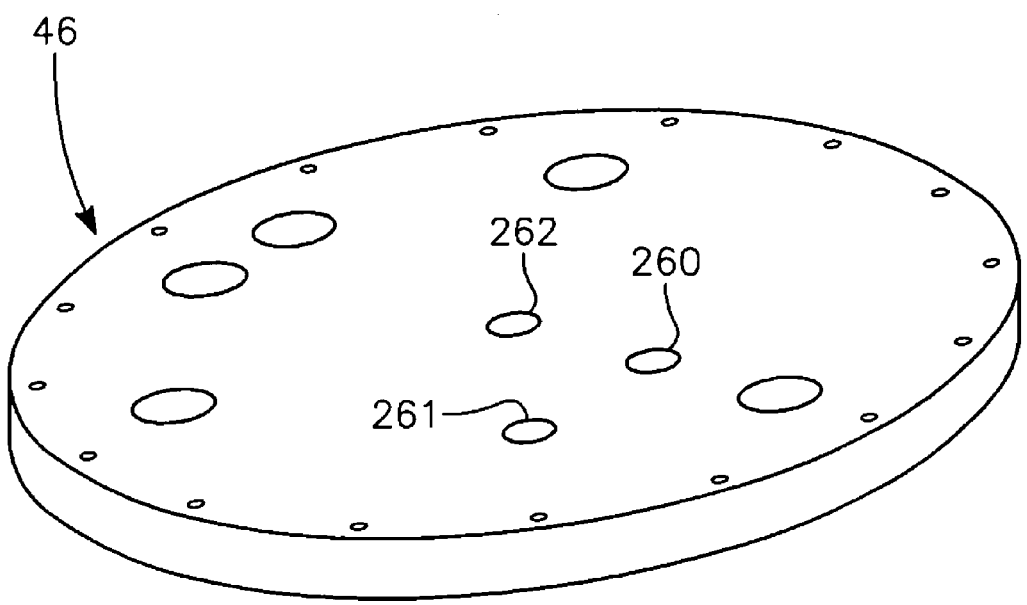
Figure 21:
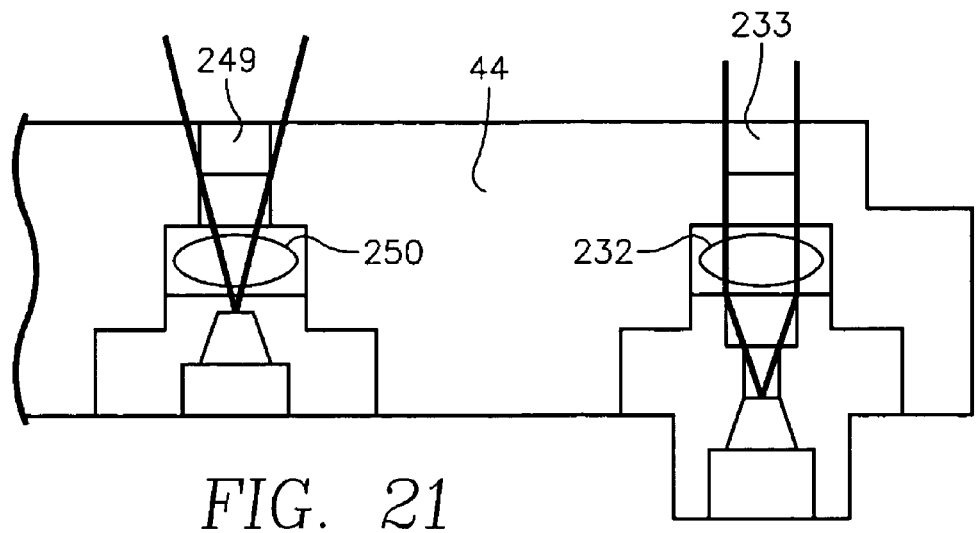
FIG. 21 is a cross-sectional view of the cathode of FIG. 19.

FIG. 18 depicts an embodiment that we have constructed, having a pair of lenses 230, 232 in respective spaced recesses 231, 233 in the surface of the cathode 44, the lenses 230, 232 being focused to resolve interference fringes, the focused light being carried by respective optical fibers 234, 236 facing or contacting the respective lenses 230, 232. The optical fibers 234, 236 are coupled to an interference detector 238 (which may be either a fringe detector or a spectrometer), the detector 238 having an output coupled to the process controller 60. The lenses 230, 232 receive light from a light source 240 through optical fibers 242, 244. This light is reflected from the top surface of the mask 18 back to the lenses 230, 232 and carried by the optical fibers 234, 236 to the detector 238. In addition, the embodiment of FIG. 18 has a third recess 249 in the cathode surface accommodating a third lens 250 coupled through an optical fiber 252 to the input of an OES spectrometer 254. An OES processor 256 processes the output of the OES spectrometer 254 to perform end point detection, and transmits the results to the process controller 60. The cathode 44 of the embodiment of FIG. 18 is depicted in FIG. 19, showing the three recesses 231, 233, 249 accommodating the respective lenses 230, 232, 250. FIG. 20 illustrates the corresponding holes 260, 261, 262 for accommodating within the facilities plate 46 optical apparatus (not shown) supporting the lenses 230, 232, 250. FIG. 21 is a cross-sectional view showing the coupling of the optical fibers to the lenses inside the pedestal 16.

While the reactors of FIGS. 16, 17 and 18 have been described as employing spectrometers 130 (FIGS. 16 and 17) and 254 (FIG. 18), the spectrometer 130 or 254 may be replaced by one or more optical wavelength filters tuned to predetermined wavelengths. Each such optical wavelength filter may be combined with a photomultiplier to enhance the signal amplitude.

Figure 22A:
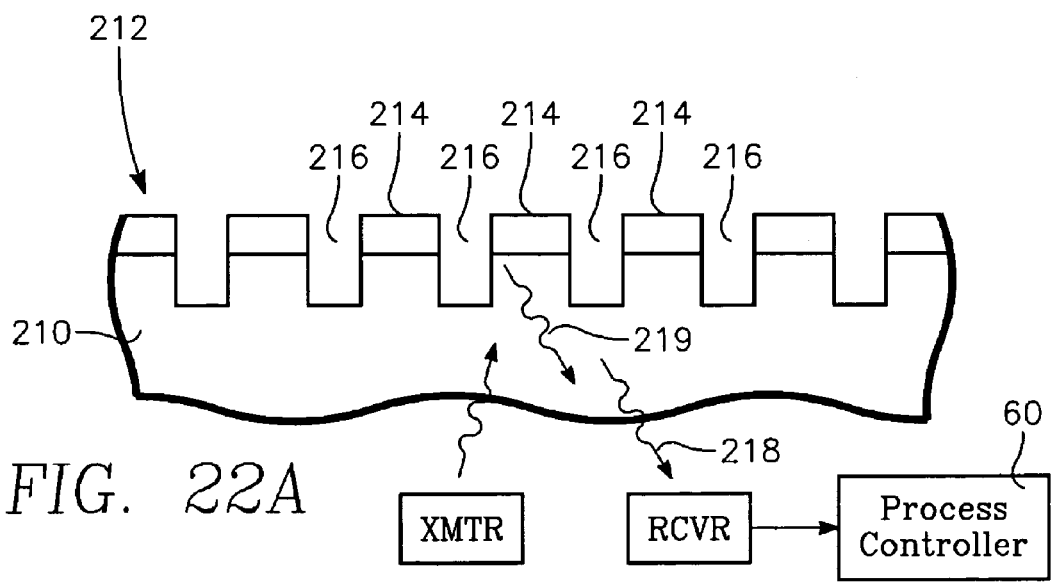
FIGS. 22A and 22B depict a sequence of steps in a quartz mask etch process employing backside endpoint detection.
Figure 22B:
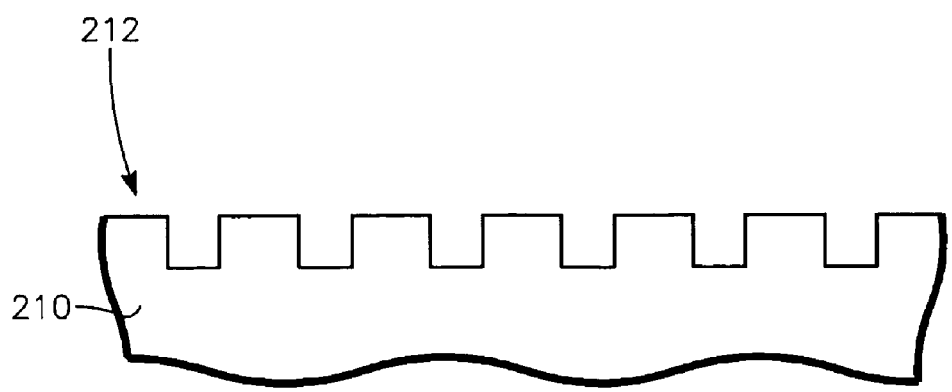

Backside End Point-Detected Mask Etch Processes:

FIGS. 22A and 22B depict a process for etching a reticle pattern in the quartz material of a mask. In FIG. 22A, a quartz mask substrate 210 has been covered with a photoresist layer 212 having a periodic structure of spaced lines 214 and openings 216 defined in the photoresist layer 212. In the reactor of FIG. 15 or 16, a quartz-etching process gas of CHF3+CF4+Ar is introduced into the chamber 10, power is applied by the RF generators 24, 26 and 48 and the quartz material is etched within the openings 216 formed in the photoresist layer 212. The etch depth in the quartz is continually measured by interference between light 218 reflected from an etched top surface and light 219 reflected from an unetched top surfaces of the quartz substrate 210. The etch process is halted as soon as the desired etch depth is reached (FIG. 22A). The photoresist is then removed to produce the desired mask (FIG. 22B).

Figure 23A:
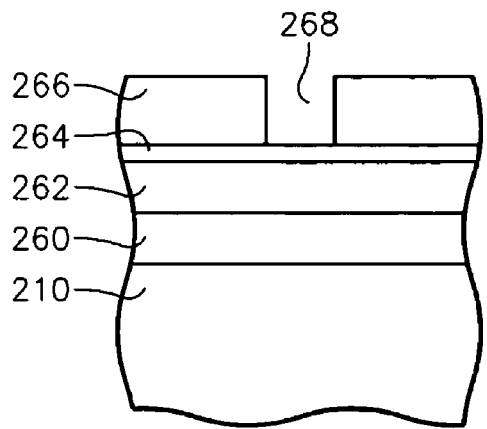
FIGS. 23A, 23B, 23C, 23D and 23E depict a sequence of steps in a chrome-molysilicide-quartz mask etch process employing backside endpoint detection.
Figure 23B:
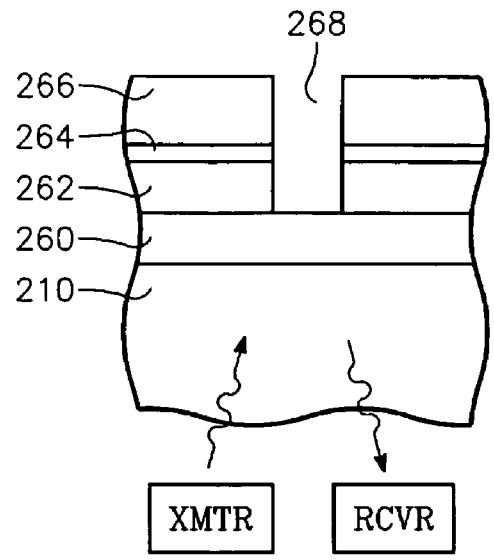
Figure 23C:
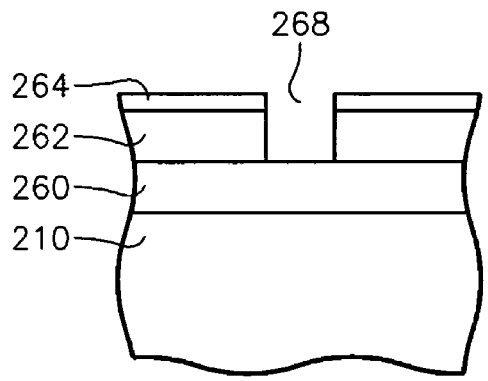
Figure 23D:
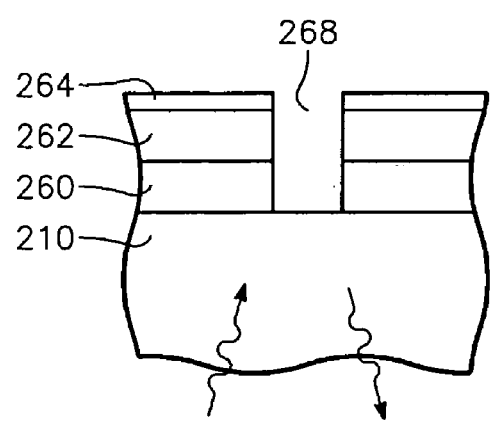
Figure 23E:
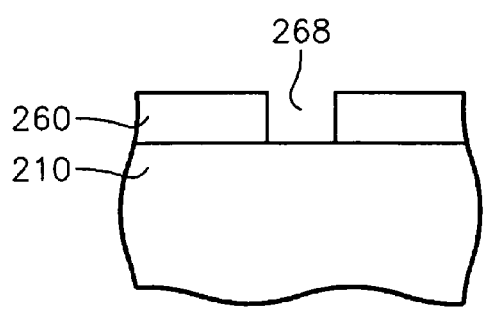

FIGS. 23A through 23E depict a process for etching a three-layer mask structure consisting of the underlying quartz mask substrate 210, a molybdenum silicide layer 260, (containing molybdenum oxy-silicon nitride), a chrome layer 262, a chromium oxide anti-reflective coating 264 and a photoresist layer 266, with openings 268 formed in the photoresist layer 266 (FIG. 23A). In the step of FIG. 23B, the chrome layer 262 and the anti-reflection coating 264 are etched in a plasma reactor chamber having simple reflectance end point detection (the chamber of FIG. 14) or having OES end point detection (the chamber of FIG. 17) using a chrome etch process gas such as C12+O2+CF4. The photoresist layer 266 is removed (FIG. 23C). The molybdenum silicide layer 260 is then etched as shown in FIG. 23D, using a process gas which is an etchant of molybdenum silicide, such as SF6+C12, and using the chrome layer 262 as a hard mask. This step is carried out in a plasma reactor having end point detection by simple ambient reflectance or by OES end point detection, such as the chamber of FIG. 14 or FIG. 17. In FIG. 23E, the chrome layer 262 and the chromium oxide anti-reflection coating 264 are removed using a chrome etching process gas such as CH3+CF4+Ar. This step can be carried out using the reactor of FIG. 14 or 17 having simple end point detection without etch depth measurement. This leaves a quartz mask substate with an overlying layer of molybdenum silicide defining the reticle pattern.

Figure 24A:
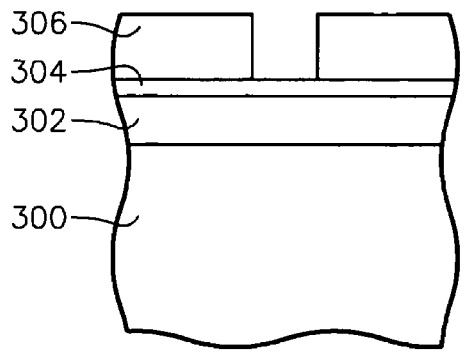
FIGS. 24A, 24B, 24C, 24D and 24E depict a sequence of steps in a chrome-quartz mask etch process employing backside endpoint detection.
Figure 24B:
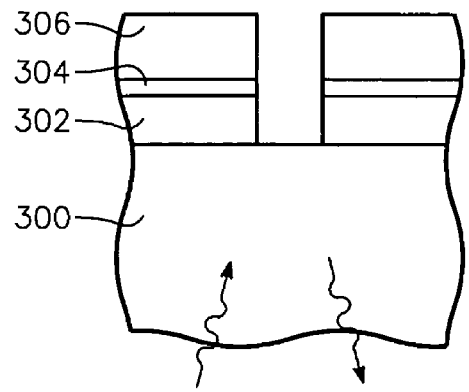
Figure 24C:
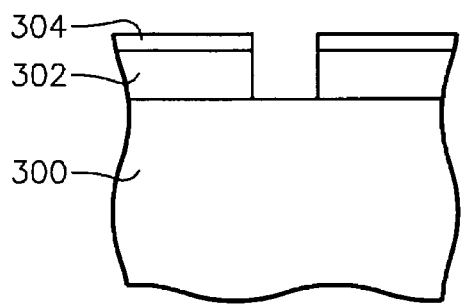
Figure 24D:
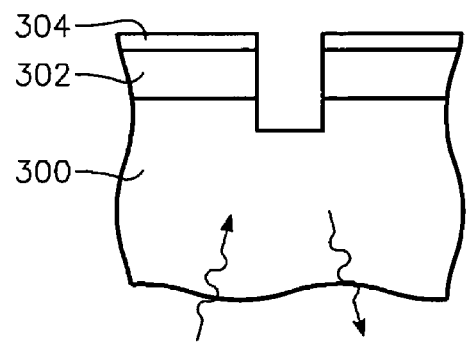
Figure 24E:
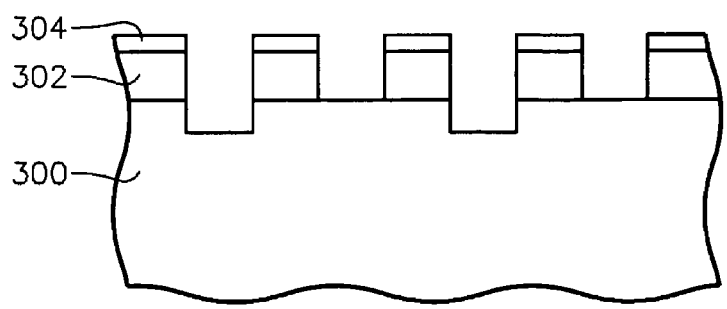

FIGS. 24A through 24E depict a process for fabricating a binary mask consisting of periodic chrome lines on a transparent quartz mask flanking periodic spaces of exposed quartz, alternate ones of the exposed quartz spaces being etched to a depth at which transmitted light is phase-shifted by a desired angle (e.g., 180 degrees). FIG. 24A depicts the initial structure consisting of a quartz mask substrate 300, a chrome layer 302, a chromium oxide anti-reflection coating 304 and a photoresist layer 306. In the step of FIG. 24B, the chrome and chromium oxide layers 302, 304 are etched in a process gas of C12+O2+CF4 in a reactor chamber such as the chamber of FIG. 14 or 17. In the step of FIG. 24C, the photoresist layer 306 is removed, after which the exposed portions of the quartz mask substrate 300 are etched as shown in FIG. 24D in a quartz-etching process gas of CHF3+CF4+Ar. The quartz etch step of FIG. 24D is carried out in a reactor chamber capable of sensing or monitoring the etch depth in the quartz mask substrate 300, such as the chamber of FIG. 15 or 16. During the etch process, the instantaneous etch depth is continually monitored, and the etch process is halted as soon as the target etch depth is reached on the mask 300. The final result is depicted in FIG. 24E.

Figure 25:
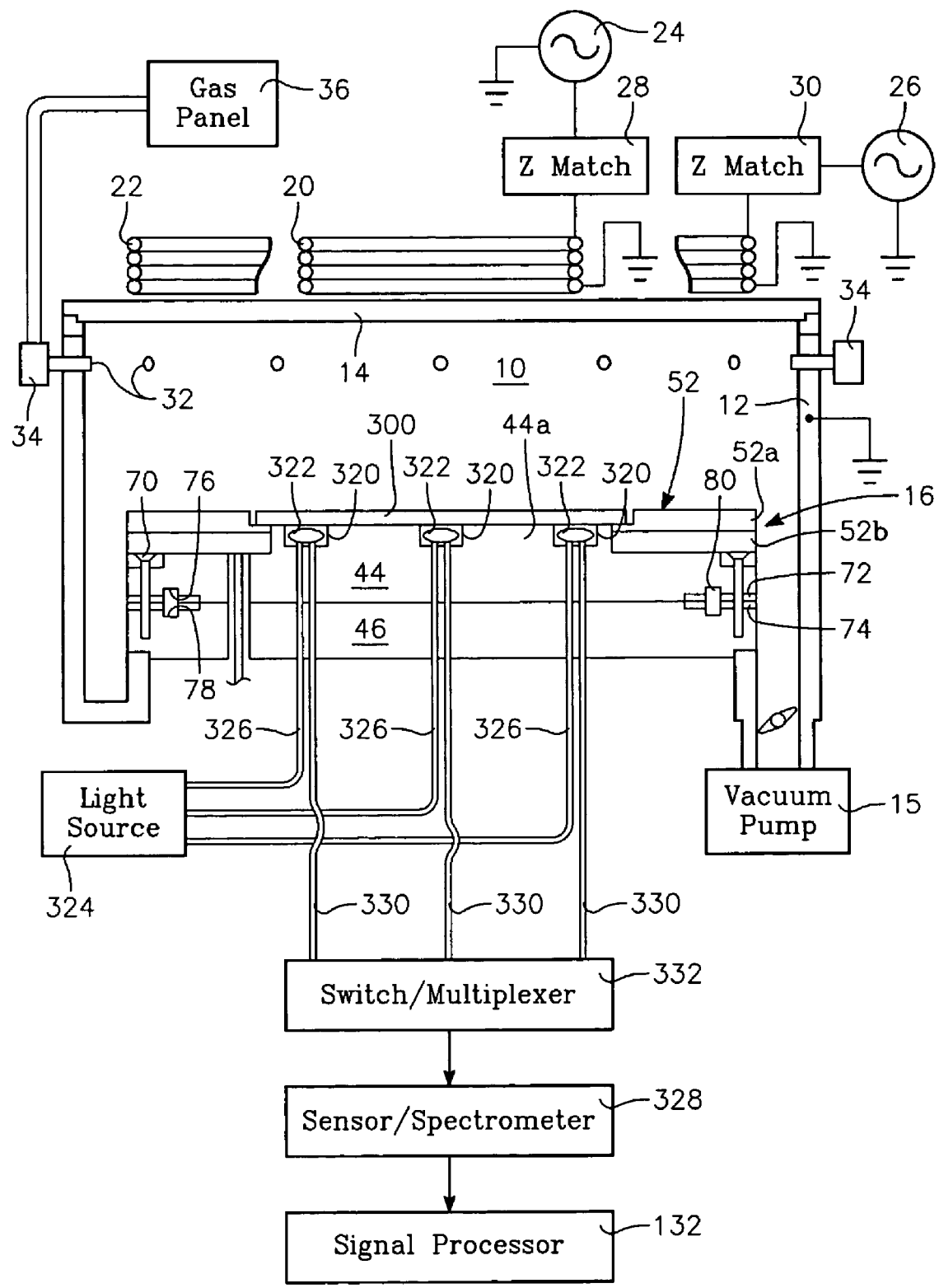
FIGS. 25 and 26 are side and top views, respectively, of an embodiment in which real time etch rate distribution is continuously measured from the mask backside.
Figure 26:
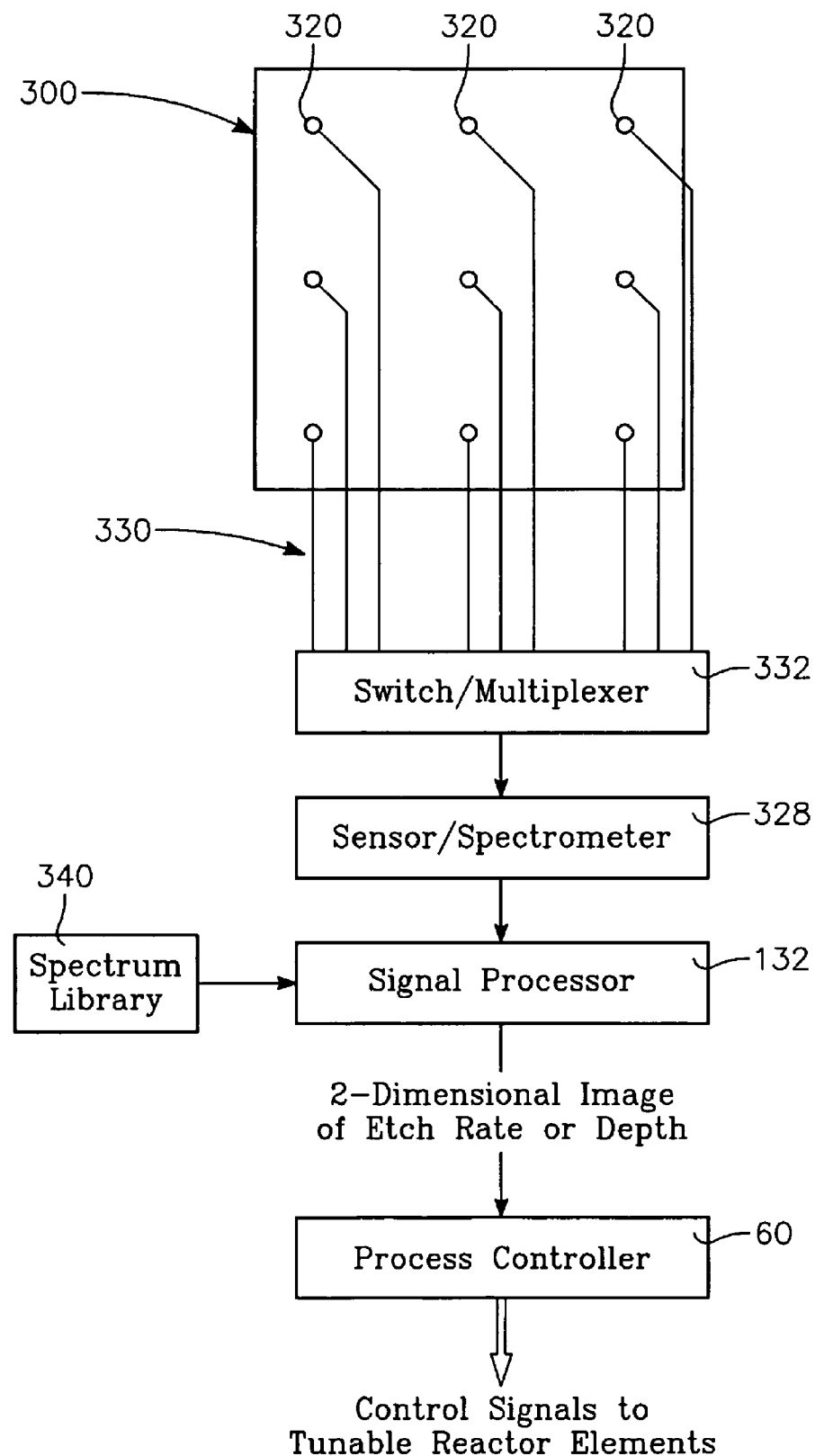

Continuous Monitoring of Etch Rate Distribution Across the Mask Surface:

FIGS. 25 and 26 illustrate an embodiment of the wafer support pedestal 16 of FIG. 1 with a matrix of backside etch depth sensing elements (lenses and optical fibers) in the top surface of the cathode 44, continuously providing an instantaneous image or sample of the etch rate distribution or etch depth distribution across the entire surface of the mask or substrate during the etch process without interrupting the etch process or otherwise disturbing the mask substrate. The aluminum plateau 44a has a matrix of openings 320 in its top surface, each opening holding a lens 322 facing the backside of the mask substrate 300. A light source 324 provides light through output optical fibers 326 coupled to the respective lenses 322. The lenses 322 provide sufficient focusing to resolve interference fringes. An interference detector 328, which may be either a sensor that facilitates fringe counting or a spectrometer, is coupled to input optical fibers 330 coupled to the respective lenses 322. A switch or multiplexer 332 admits light to the detector 328 from each of the input optical fibers 330 sequentially. There are three modes in which the apparatus of FIG. 25 and 26 may operate. In a first mode, the etch depth in the field of view of a given one of the lenses 322 is computed from the interval between interference fringes. In a second mode, the detector 328 is a spectrometer and the etch depth in the field of view of a given one of the lenses 322 is computed from the lower wavelength peak interval of the multiple wavelength interference spectrum (corresponding to FIG. 13). In a third mode, the multiple wavelength interference spectrum is detected at a given instant of time and compared with a library 340 of spectra for which the corresponding etch depths are known. The etch rate distribution is computed from the etch depth and the elapsed time. This distribution records the etch nonuniformity of the process and is fed to the process controller 132. The controller 132 can respond by adjusting tunable features of the reactor to reduce non-uniformity in the etch rate distribution.

While the embodiment of FIGS. 25 and 26 is depicted as having a 3-by-3 matrix of etch depth sensors or lenses 322 in the top surface of the plateau 44a, any number of rows and columns in the matrix of such sensors may be employed so that the matrix is an n-by-m matrix, where m and n are suitable integers.

In one embodiment, the process controller 132 may be programmed to deduce (from the etch rate distribution information supplied by the spectrometer or sensor 130) whether the etch rate distribution is center high or center low. The process controller 60 can respond to this information by adjusting certain tunable features of the reactor to decrease the non-uniformity. For example, the process controller 60 may change the RF power apportionment between the inner and outer coils 20, 22. Alternatively or in addition, the process controller 60 may change the height of the movable aluminum plate 112 in the reactor of FIGS. 6 and 7. Feedback from the array or matrix of etch depth sensing elements in the plateau 44a allows the process controller 60 to improve uniformity of etch rate distribution by continuous trial and error adjustments of the reactor tunable elements.

Figure 27:
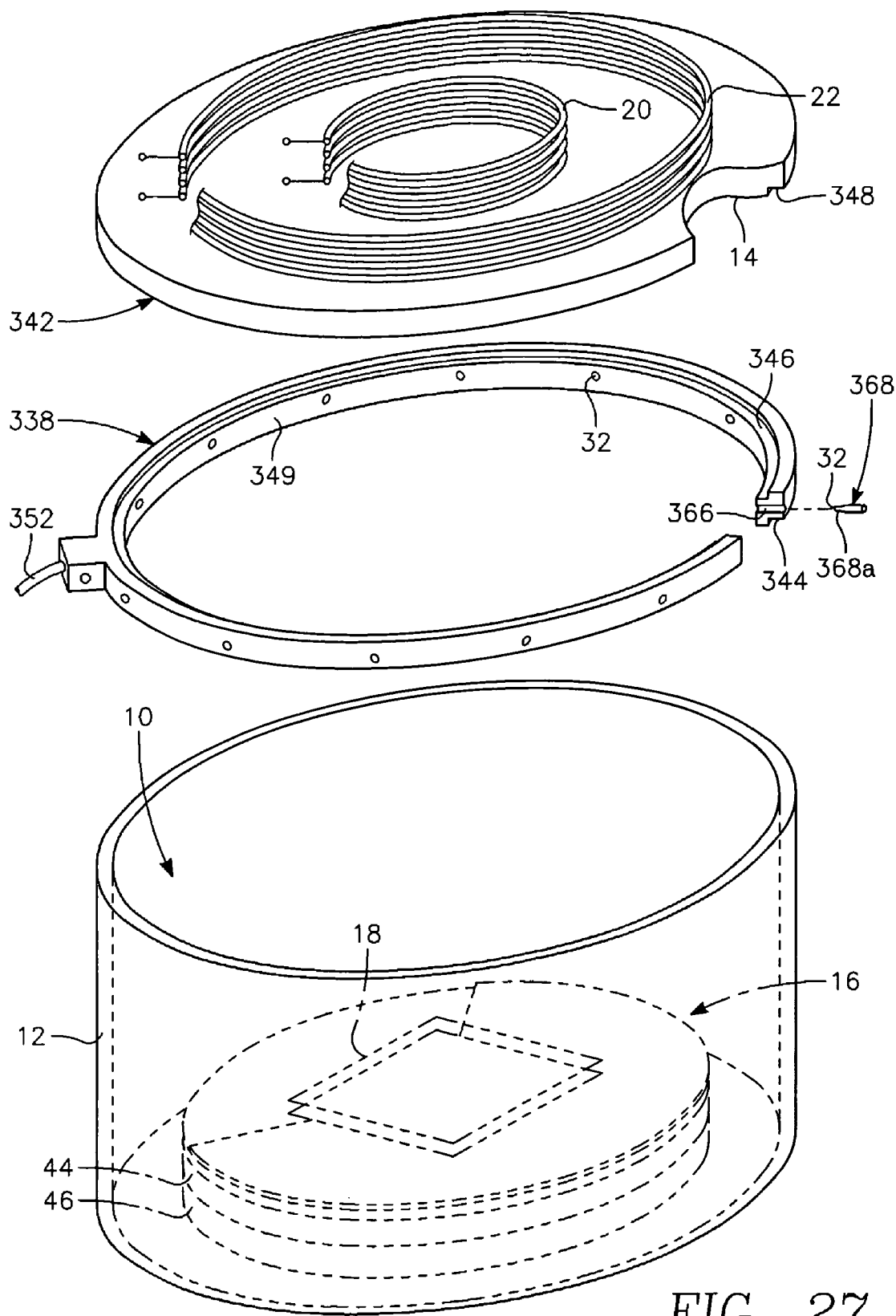
FIGS. 27 and 28 are perspective and top views, respectively, of an embodiment having an array of individually controllable gas injection nozzles.
Figure 28:
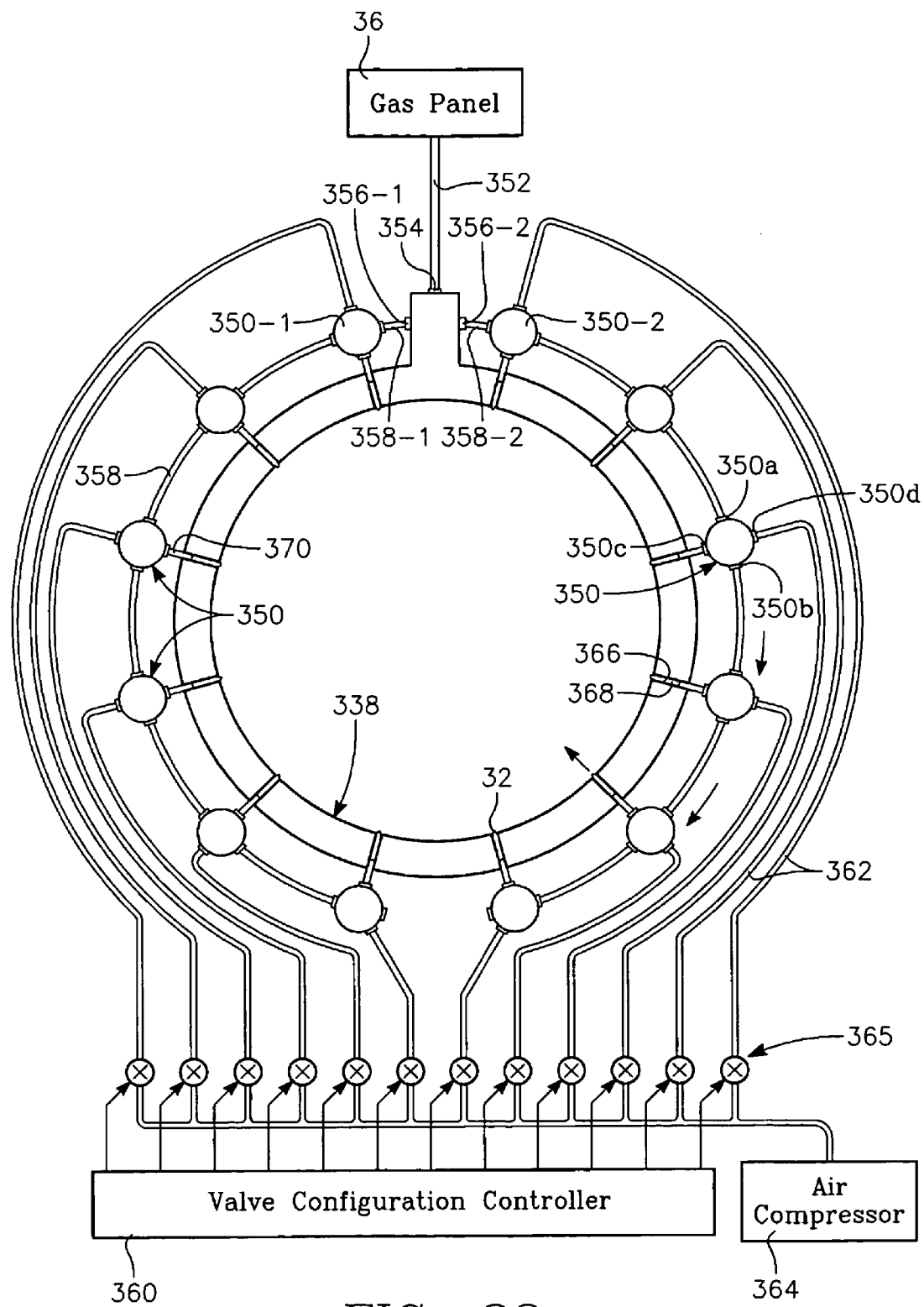

Real-time Configurable Process Gas Distribution:

FIGS. 27 and 28 illustrate an embodiment of the plasma reactor of FIG. 1 having an array of individually controllable gas injection orifices or nozzles 32. By individually controlling the different nozzles 32, gas distribution within the chamber 10 can be changed to correct non-uniform distribution of etch rate across the workpiece or mask 18. In the illustrated embodiment, the array of gas injection nozzles 32 is located on the side wall 12 near the ceiling 14. For this purpose, the reactor includes a top ring 338 that is held between the top of the side wall 12 and a removable lid 342 having a bottom surface that constitutes the ceiling 14. An exterior shoulder 344 in the bottom surface of the top ring 338 rests on the top surface of the sidewall 12. An interior shoulder 346 on the top surface of the ring receives the edge of the lid 342. An external shoulder 348 is provided in the bottom surface of the lid 342 that rests in the internal shoulder 346 of the ring 338. The gas injection orifices or nozzles 32 are formed in the vertical interior surface 349 of the ring 338. Gas flow to each of the injection nozzles 32 is individually controlled by a separate valve 350, there being one valve 350 for each of the nozzles 32. Process gas supplied from the gas panel 36 flows through a gas supply line 352 that is coupled to an input port 354 formed on the ring 338. Gas supply outlets 356 formed on the ring 338 output the process gas received at the input port 354. A series of disconnectable gas flow lines 358 form series connections outside the periphery of the ring 338 that communicate process gas from each of the gas supply outlets or ports 356 to a corresponding set of the valves 350.

In a preferred embodiment, each valve 350 is pneumatically controlled, and has an input flow-through port 350a and an output flow-through port 350b, a controlled gas outlet port 350c and a pneumatic pressure control input port 350d. The outlet port 350c provides a controlled process gas flow to a corresponding one of the nozzles 32. Process gas flows freely from the input flow-through port 350a to the output flow-through port 350b. Compressed air pressure at the control input port 350d determines whether any of the process gas passing through the flow-through ports 350a, 350b is diverted to the gas outlet port 350c. Such pneumatically controlled valves are well-known, and therefore their internal structure need not be disclosed here. The gas flow lines 358-1 and 358-2 are connected from the gas supply outlets 356-1, 356-2 to the input flow-through ports 350a of the valves 350-1, 350-2. Each of the remaining gas flow lines 358 are connected from the output flow-through port 350a of one valve 350 to the input flow-through port 350b of a successive valve 350. Thus, gas flow through the series of valves 350 in the left side of the drawing of FIG. 28 is counter-clockwise, while gas flow through the series of valves 350 in the right side of the drawing of FIG. 28 is clockwise.

Gas flow from each output port 356 to the series of valves 350 connected to it is not blocked by any intervening valve 350 in the series. Each valve 350 can be turned "on" without turning on or off any of the other valves 350 to provide gas flow to a corresponding gas injection orifice 32, and can be turned "off" to terminate gas flow to that injection orifice. A valve configuration processor 360 controls all of the valves 350 and can turn on or off any combination of the valves 350 via valve control links 362. As stated above, in a preferred embodiment the valves 350 are pneumatic valves and the control links 362 are pneumatic (air) tubes in order to avoid the presence of electrical conductors near the coil antennas 20, 22. In the embodiment of FIG. 28, a compressor 364 furnishes air under pressure to an array of solenoid (i.e., electrically controlled) valves 365 that control application of the pressurized air to pneumatic control inputs 350a of the respective pneumatic valves 350. The valve configuration processor 360 controls the solenoid valves 365 through electrical links that are remote from the coil antennas 20, 22.

Figure 29:
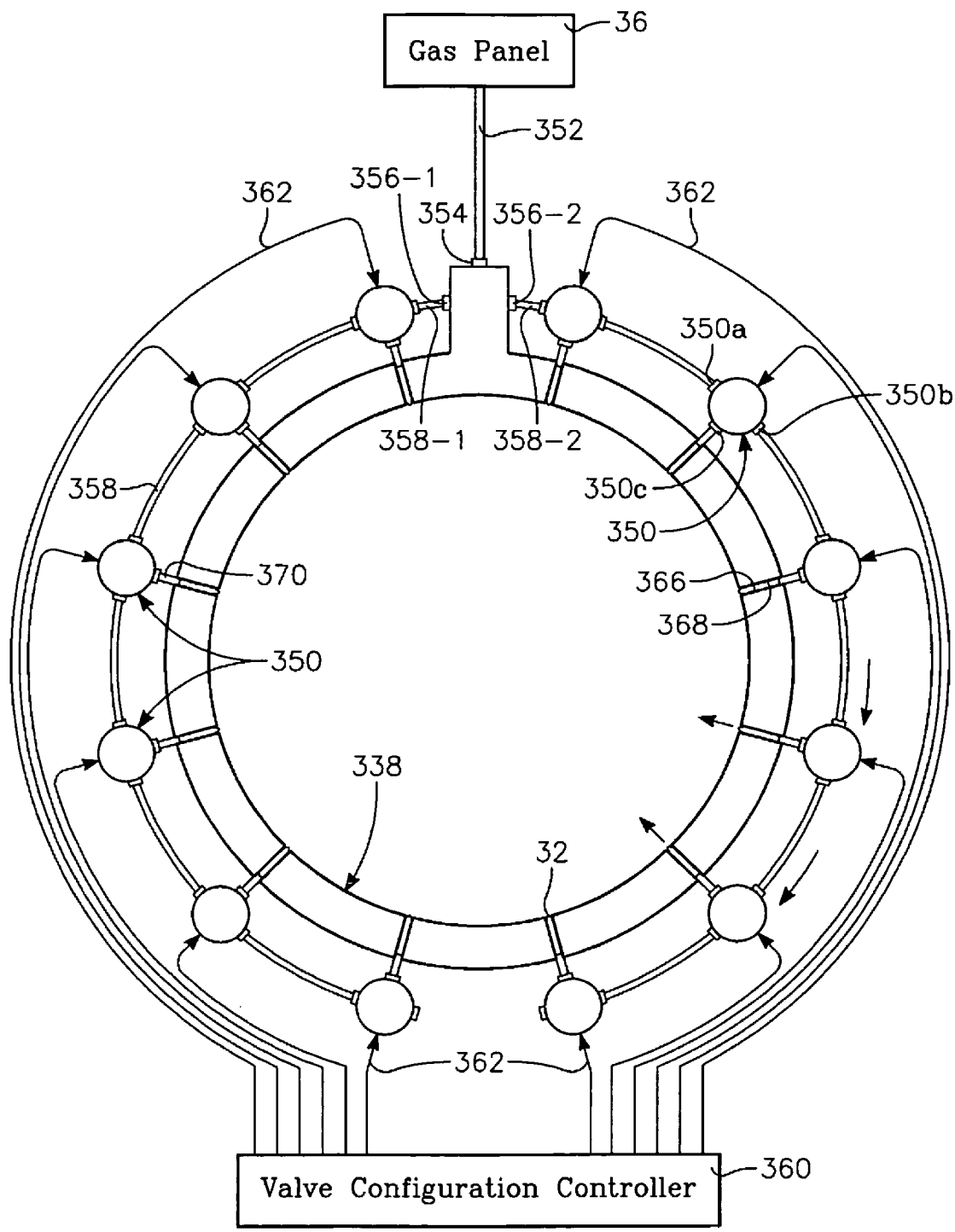
FIG. 29 is a top view of an implementation of the embodiment of FIGS. 27 and 28 employing pneumatic valves.

FIG. 29 depicts a modification of the embodiment of FIG. 28 in which the valves 350 are each electrically controlled rather than pneumatically controlled. In FIG. 29, each of the control links 362 is an electrical line extending directly from the controller 360 to a corresponding one of the valves 350, and the air compressor 364 and array of compressed air solenoid valves 365 are eliminated.

Referring again to FIGS. 27 and 28, each orifice 32 is formed from a radial cylindrical passage 366 through the ring 338. A hollow cylindrical sleeve 368 is received within the passage 366, the tip 368a of the sleeve 368 forming the gas injection orifice. The injection orifice diameter at the tip 368a having a diameter on the order of 0.030 inch, for example. Each sleeve 368 may be formed of a ceramic material and may be removable. The controlled gas outlet port 350c of each valve 350 is connected through a short gas supply line 370 to the outer end of the corresponding radial passage 366. The entire gas distribution assembly is modular and quickly disassembled by the connection (or disconnection) of each of the outer gas supply lines 358 and the short gas supply lines 370, the sleeves 368 being separately removable from the holes 366. In this way, the gas distribution components and assembly support on the ring 338 are readily replaced on an individual basis, without requiring removal or replacement of more expensive components of the reactor, such as the ring 338 for example.

Figure 30A:
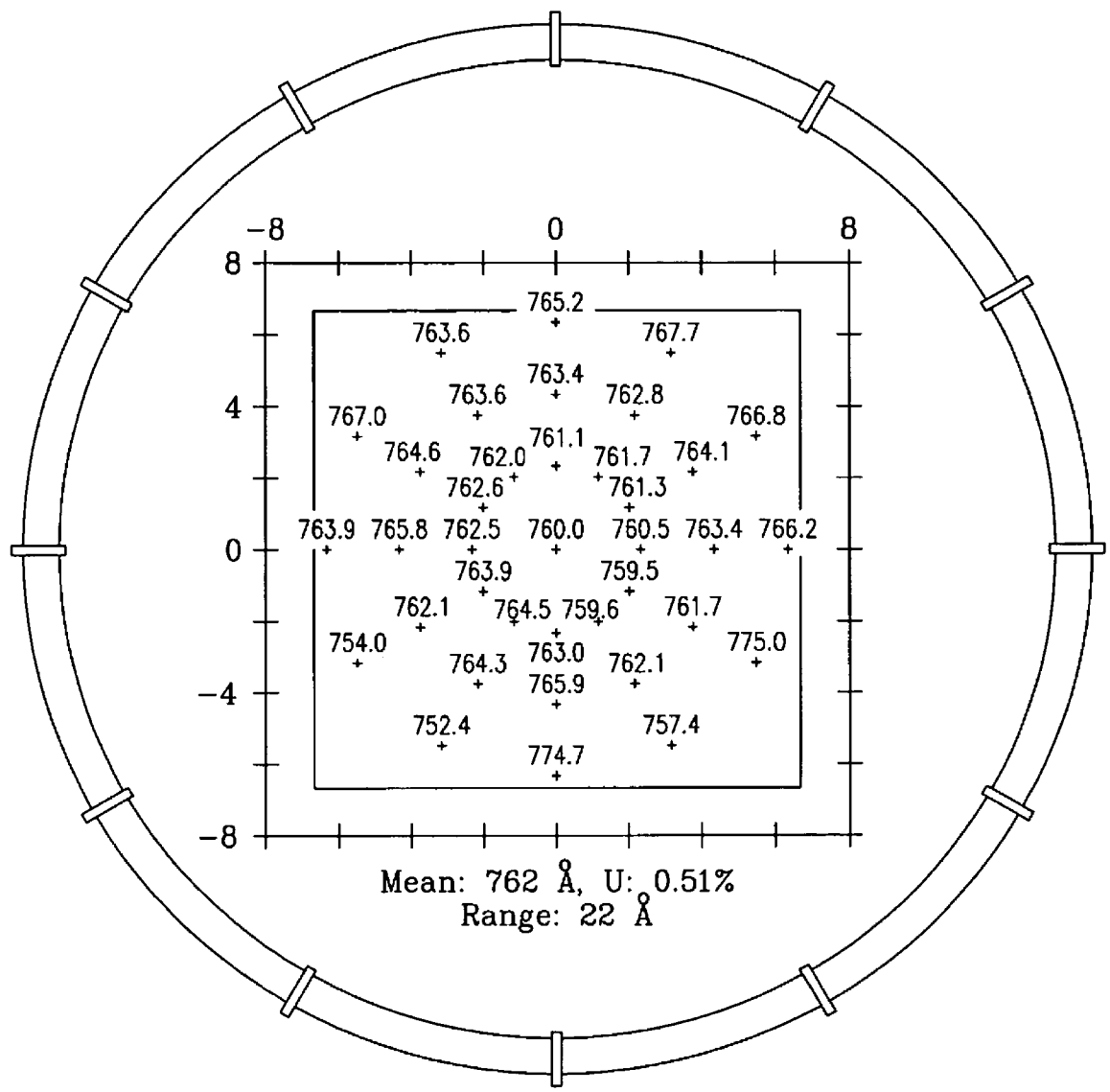
FIGS. 30A through 30D are graphs of etch depth distribution across a mask obtained with different ones of the array of valves of FIGS. 27 and 28 being activated.
Figure 30B:
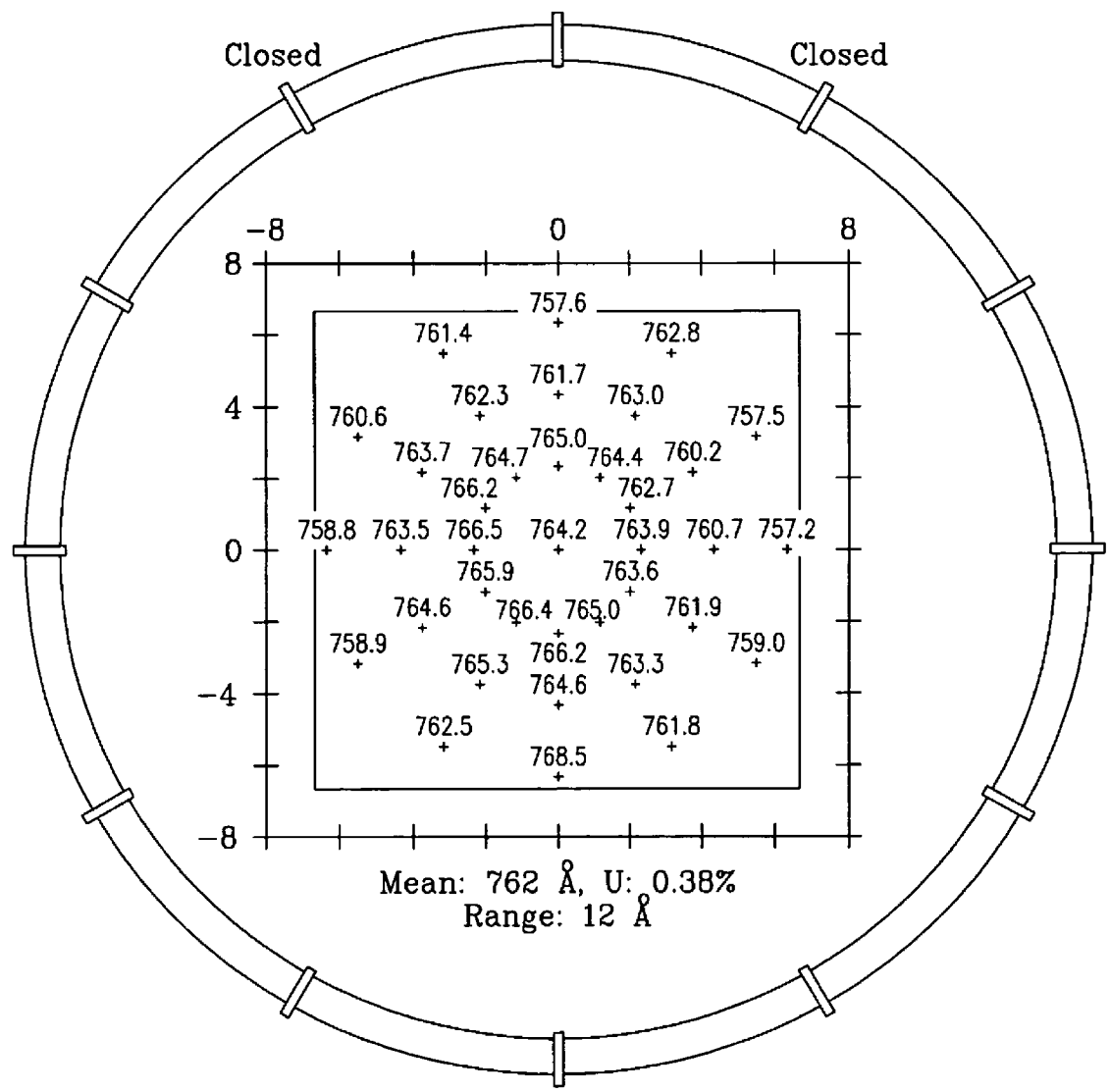
Figure 30C:
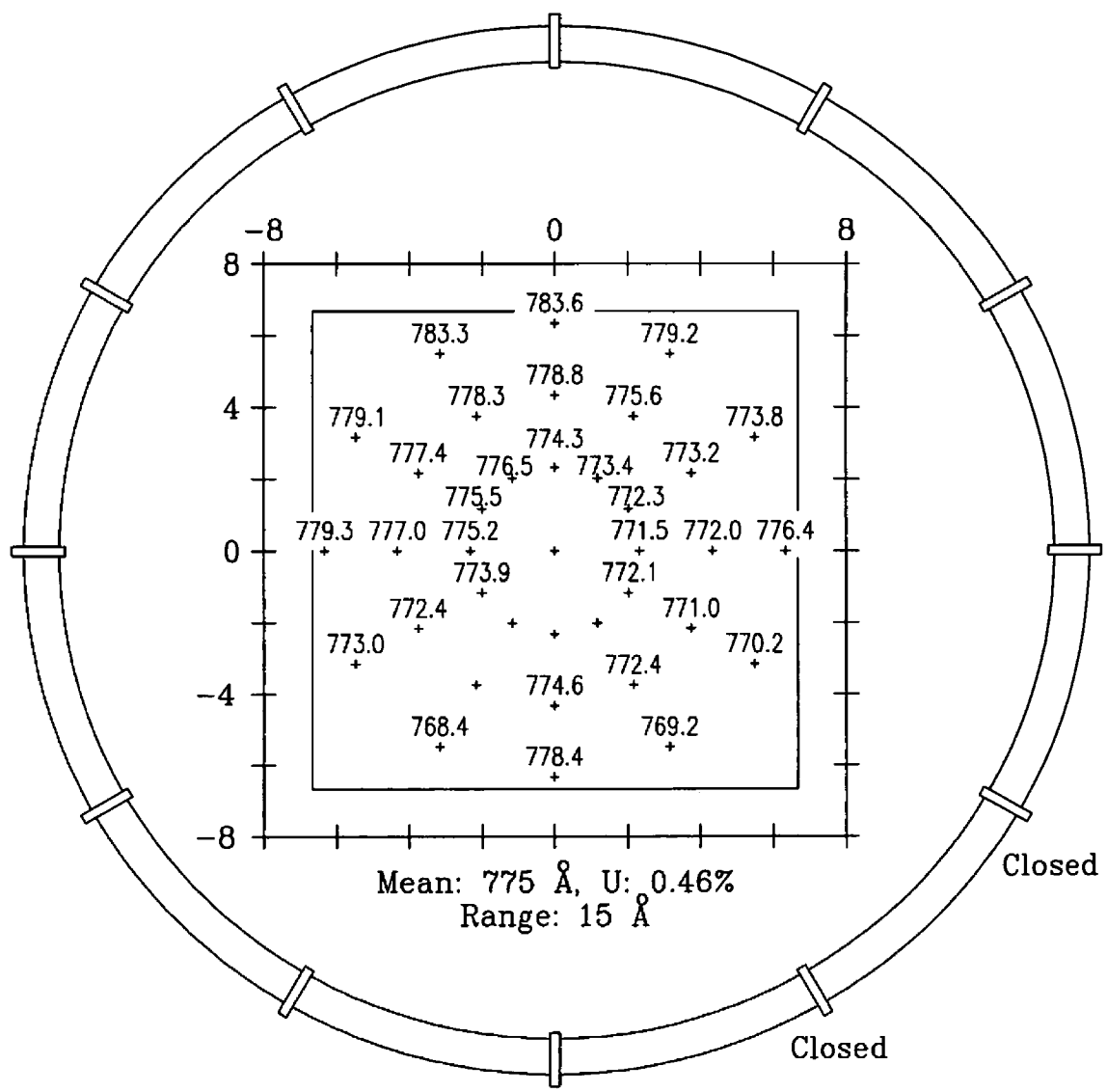
Figure 30D:
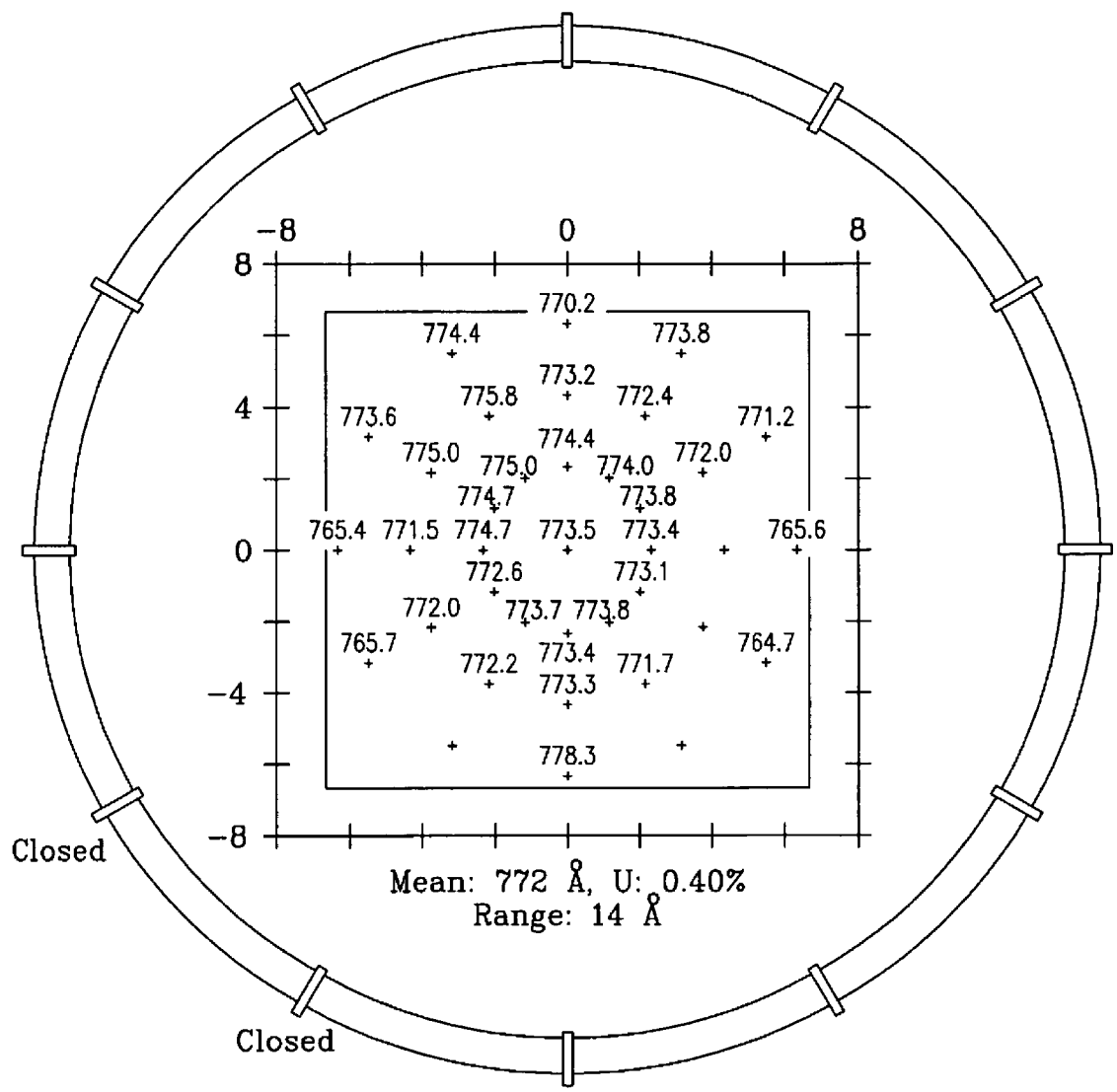

FIGS. 30A through 30D are graphs of the etch depth distribution over the mask 18 obtained in a fixed time period of an etch process carried out in the reactor of FIGS. 27 and 28 for different valve configurations. The etch distribution of FIG. 30A was obtained when all valves 350 were open, and is generally a center low etch distribution, with a high non-uniformity or variation of 0.51% across the mask surface. The distribution of FIG. 30B was obtained with a pair of adjacent valves 350a, 350b closed, and the remaining valves 350 being open, and a more nearly uniform distribution, with a non-uniformity or variation of only 0.38%. FIG. 30C was obtained by returning the valve configuration back to the state in which all valves 350 were open. The distribution of FIG. 30C is more center low. The distribution of FIG. 30D was obtained by closing a different pair of adjacent valves 350c, 350d. The resulting distribution was more uniform and less center-low, with a variation of only 0.40%.

Figure 31:
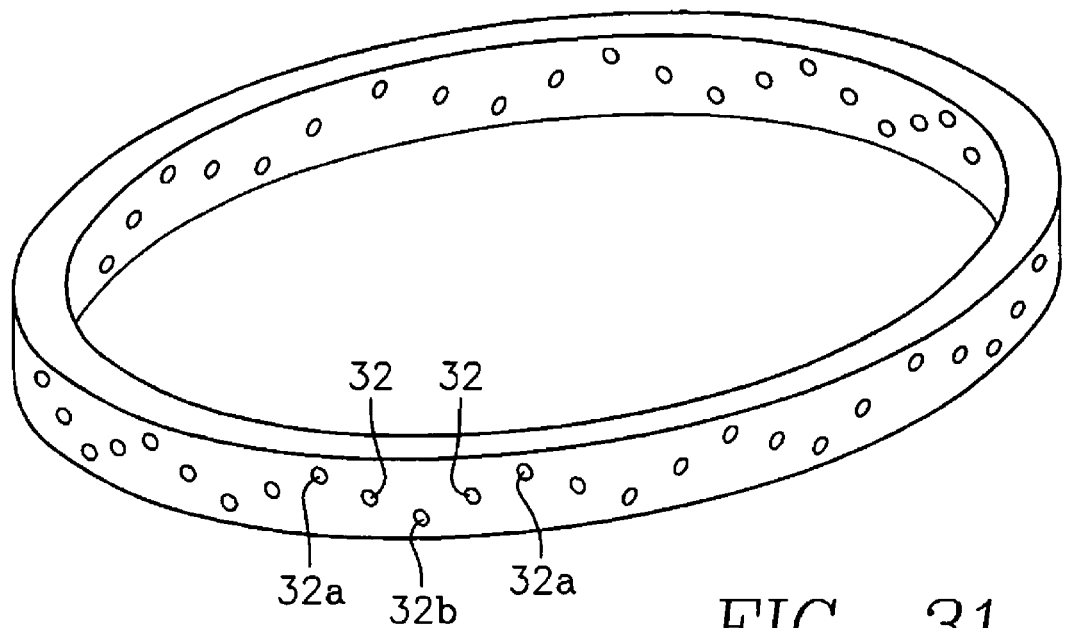
FIG. 31 depicts an alternative embodiment of the reactor of FIGS. 27 and 28.
Figure 32:
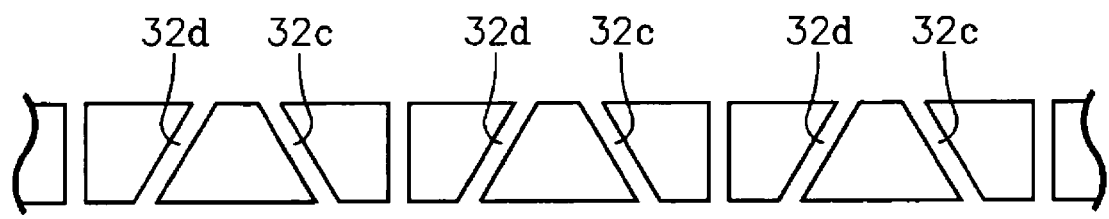
FIG. 32 depicts another alternative embodiments of the reactor of FIGS. 27 and 28.

FIG. 31 illustrates an alternative embodiment in which the gas injection nozzles 32 are placed in a zig-zag or "W" pattern in the ring 338. Each nozzle is independently controlled as in the foregoing embodiments. The injection pattern may be moved relative to the ceiling by activating only the top row 32a or only the bottom row 32b of nozzles. The distance between nozzles may be changed by activating only selected nozzles 32 (e.g., every third nozzle or every fourth nozzle). FIG. 32 is a cross-sectional view of a portion of the ring 338 depicting how the nozzles 32 may be arranged to spray in different directions. Large changes in gas distribution may be obtained by the valve configuration controller 360 turning on only those nozzles 32 oriented in a particular direction, for example. For example, all the nozzles 32c angled toward the right in the view of FIG. 32 may be simultaneously turned on to the exclusion of all others. A large change or correction may be obtained by turning on all nozzles 32d angled toward the left while turning off all others including all the right-angled nozzles 32c, for example.

Figure 33:
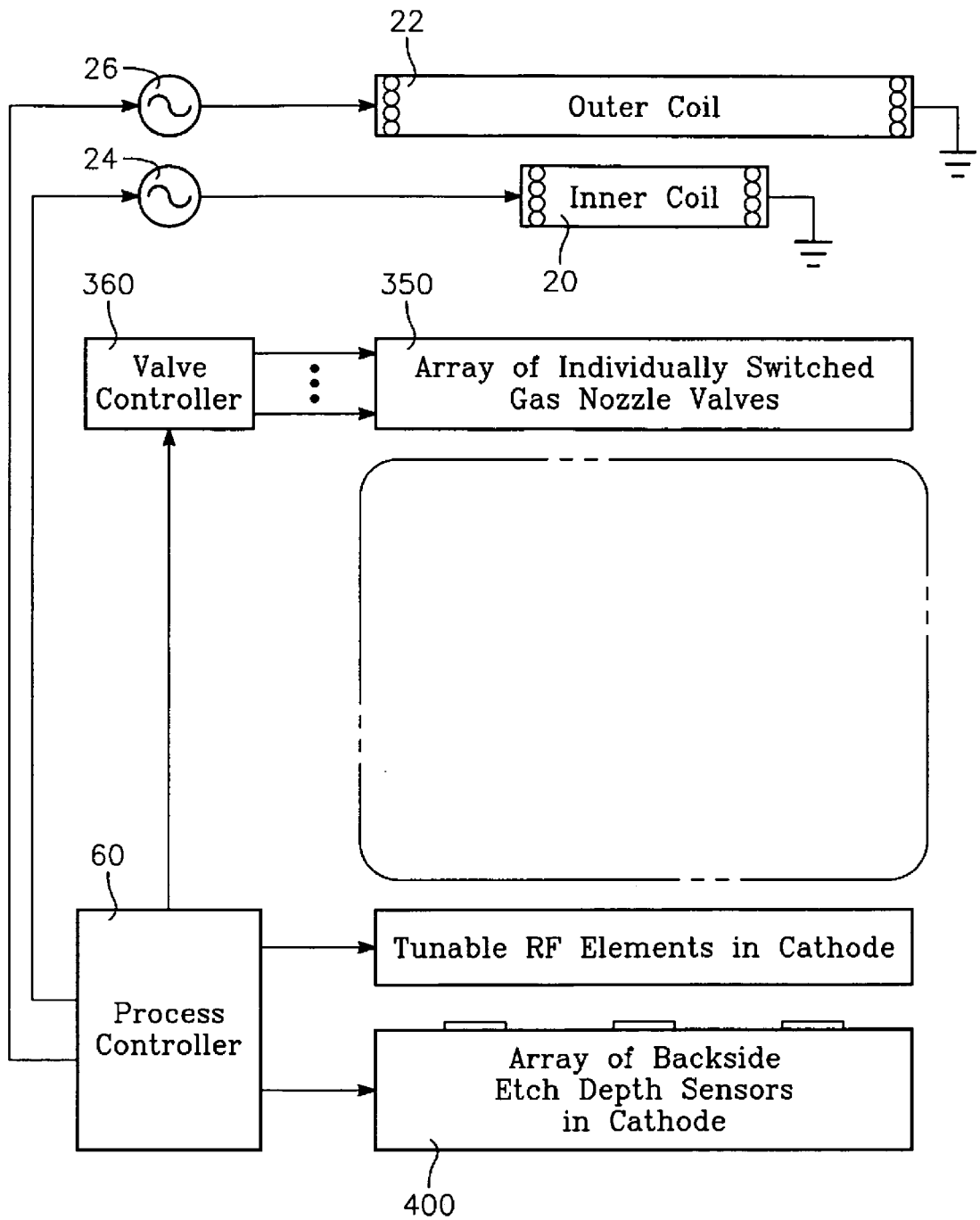
FIGS. 33 and 34 are a block diagram and a perspective view, respectively, of a plasma reactor capable of performing real-time feedback control of reactor tunable elements based upon instantaneous two-dimensional images of etch rate distribution.
Figure 34:
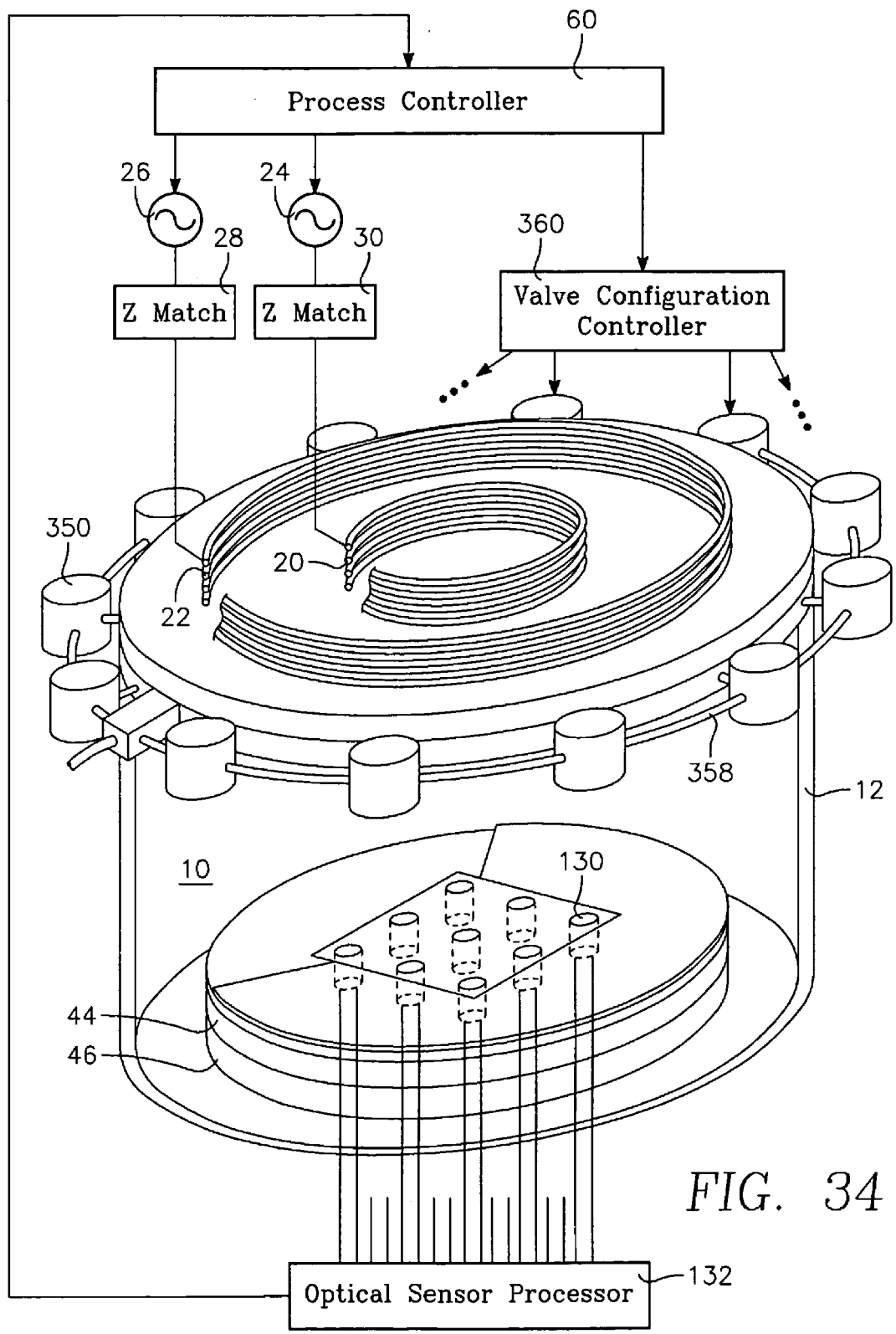

Controlling Tunable Reactor Elements with Feedback from an Array of Backside Etch Depth Measurement Sensors:

Referring now to FIGS. 33 and 34, feedback control of a tunable elements of the mask etch plasma reactor is provided using the output of the two-dimensional array of backside etch depth sensors of FIGS. 25 and 26. The tunable element or elements may include the array of individually controlled gas injection nozzles 32 of FIGS. 27 and 28. Alternatively, or in addition, the tunable element controlled in such a feedback loop may include the RF power apportionment between the inner and outer coils 20, 22 or the height of the movable aluminum plate 112 in the reactor of FIGS. 6 and 7.

Feedback from the array or matrix of etch depth sensing elements 130 of FIGS. 25 and 26 allows the process controller 60 to improve uniformity of etch rate distribution by continuous trial and error adjustments of the reactor tunable elements. In FIG. 33, a feedback loop begins with the array 400 of the backside etch depth sensors 130 of FIGS. 25 and 26. The process controller 60 is programmed to use the image of instantaneous etch depth measurements across the mask 18 to infer the locations and magnitudes of non-uniformities in the etch rate on the mask 18 and to deduce the likeliest changes in a particular tunable element of the reactor that would reduce or eliminate such non-uniformities. This information is converted by the processor 60 into a command (or commands) to be sent to any one or some or all of the tunable elements of the reactor. Thus, FIG. 33 shows output signal paths from the process controller 60 to the following tunable elements, any one or all of which may be present in the reactor: the inner and outer antenna RF power generators 24, 26 (for inner and outer RF power apportionment); the actuator 110 for the movable aluminum plate 112; the nozzle array controller 360 of the array of controllable nozzles 32.

The feedback loop may be operated continuously during the entire mask etch process to improve etch rate distribution uniformity across the mask 18 by reducing non-uniformities perceived by the processor 60 from the "image" of etch rate distribution across the mask 18. The feedback can be governed by software in the processor 60 for performing trial and error corrections. Alternatively, the software in the processor 60 can incorporate commercially available neural training and feedback learning techniques that enable the processor 60 to respond more intelligently to perceived non-uniformities in the etch rate distribution. Such software techniques form no part of the present invention.

In one embodiment, the feedback commands to the tunable element (or elements) may be generated to reduce the variation among the array of etch depth sensors. In another embodiment, the feedback may be selected to address a particular non-uniformity. For example, the etch rate distribution sensed by the array of sensors 130 may be very high in one quadrant or corner of the mask 18, in which case the valve configuration processor is commanded to reduce gas flow in that one quadrant by a limited (trial) amount. If this expedient meets with limited success according to subsequent images of the etch rate distribution obtained from the array of backside sensors 130, then this adjustment in the gas flow distribution may be increased. This cycle of adjustments and corrections may be continued until there is no further improvement in etch rate distribution uniformity.

Other non-uniformities may be handled on a similar basis after the first one has been corrected. For example, the etch rate in a different location may be extremely high, in which case the gas flow to that location is reduced as long as this results in some reduction in this non-uniformity over a number of samples of the etch rate distribution "image" from the array of backside sensors 130.

In the case of etch rate distribution non-uniformities that are symmetrical (e.g., a center-high or a center-low distribution) symmetrical tunable elements such as the height of the aluminum plate 112 or the RF power apportionment between the inner and outer coils 20, 22 may be employed by the processor 60 to reduce the non-uniformity using the feedback control loop. For example, a center-low etch rate distribution may be rendered less non-uniform by the processor 60 increasing the etch rate in the center of the mask 18 by either (or both) raising the aluminum plate 112 or increasing the apportionment of RF power to the inner coil 20 (relative to the outer coil 22). In the feedback loop, this change may be small initially, and as the etch distribution image from the array of backside sensors 130 improves in uniformity, the position of the aluminum plate and/or the apportionment of power to the inner coil 20 may be further increased. This cycle may continue until no further improvement is observed. All of the foregoing techniques may be embedded in the software executed by the process controller 60.

Figure 35:
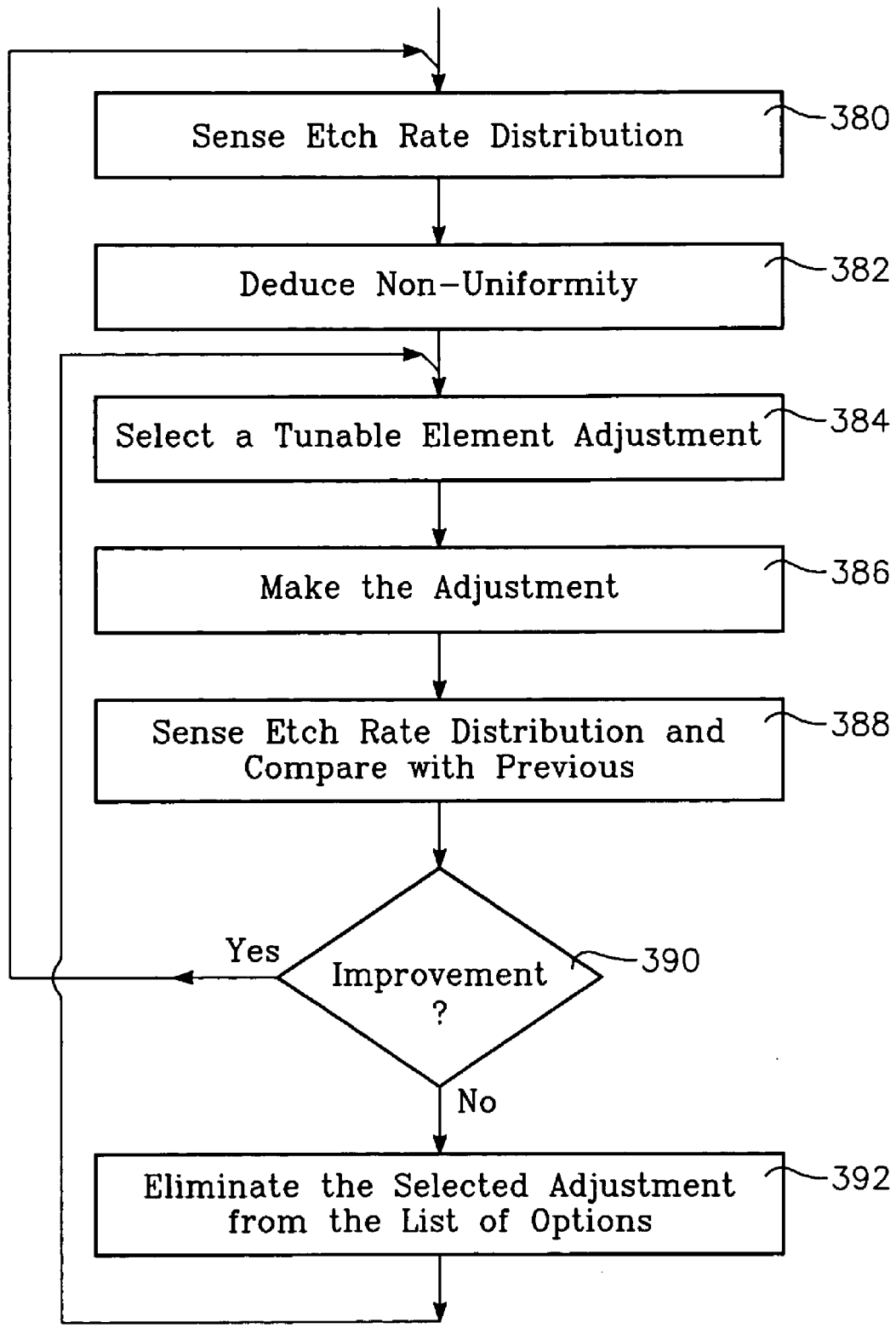
FIG. 35 is a block diagram of a feedback control process that may be performed in the reactor of FIGS. 33 and 34.

FIG. 35 depicts one possible example of a feedback cycle performed by the process controller 60 in the embodiment of FIGS. 33 and 34. First, the processor 60 obtains the latest two-dimensional image of etch rate across the mask surface from the array of backside sensors 130 (block 380 of FIG. 35). From this image, the processor 60 deduces the pattern of non-uniformity in etch rate distribution (block 382) and selects an adjustment to one of the tunable elements of the reactor from a list of options that may reduce the non-uniformity (block 384). After making this adjustment (block 386), the processor 60 obtains the latest etch rate distribution image (block 388) and compares it with the previous image taken prior to the adjustment. If there is an improvement (a lessening in the non-uniformity), the processor 60 repeats the same cycle, probably resulting in further increases in the same successful adjustment. If there is no improvement (NO branch of block 390), then the selected adjustment is removed from the list of options (block 392), and a different adjustment is selected by returning to the step of block 384.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
   a vacuum chamber comprising a cylindrical side wall, a ceiling overlying said side wall and a ring supported on a top edge of said side wall and supporting said ceiling, said ring comprising an external surface and an interior surface;
   an RF plasma source power applicator and an RF source power generator coupled to said applicator;
   plural passages extending in a radial direction through said ring from said external surface to said interior surface and being spaced apart along a circumference of said ring;
   a process gas supply;
   a succession of detachable gas flow lines spaced from and outside of said ring and of said chamber and arranged end-to-end around a circumference of said chamber and a single gas supply line coupled between said succession of gas flow lines and said process gas supply;
   plural external gas flow valves outside of said chamber and coupled between successive ones of said gas flow lines at respective locations spaced apart relative to said circumference, each of said valves having: (a) a controlled gas output port individually coupled to a respective one of said plural passages at said external surface of said ring, (b) a valve control input governing gas flow through said controlled gas output port, (c) an input flow-through port connected to a first one of the corresponding pair of gas flow lines, (d) an output flow-through port connected to the other one of said corresponding pair of gas flow lines, (e) an unblockable flow-through passage between said input and output flow-through ports, wherein each of said gas flow lines is separately disconnectable from the valve to which it is connected;

a workpiece support within said chamber having a support surface for supporting a workpiece facing said ceiling and generally parallel to and concentric with said ring; and a gas valve configuration controller controlling the valve control input of each of said valves.

2. The reactor of claim 1 wherein said external valves are separately removable from said chamber and separately re-connectable to said chamber.

3. The reactor of claim 1 wherein each of said valves is a pneumatically controlled valve, said reactor further comprising:

a pressurized air source;

plural electrically controllable air valves coupled between said pressurized air source and the valve control inputs of respective ones of said external gas flow valves; and individual signal paths between said controller and the valve control inputs of respective ones of said gas flow control valves.

4. The reactor of claim 1 further comprising a plurality of hollow sleeves within respective ones of said plural passages in said ring, each of said sleeves having a gas receiving end at said exterior surface of said ring and a gas output end at said interior surface of said ring, said gas output end of each of said sleeves defining a gas injection orifice.

5. The reactor of claim 4 wherein said sleeves are individually removable from said passages and separately re-insertable into said passages and said external valves are separately removable from said chamber and separately re-connectable to said chamber.

6. The reactor of claim 5 wherein said sleeves each formed of a ceramic material.

7. The reactor of claim 1 wherein said ring comprises:

an externally facing shoulder for receiving said top edge of said cylindrical side wall;

an internally facing shoulder for receiving a peripheral edge of said ceiling.

8. The reactor of claim 1 wherein said internal surface of said ring is cylindrical and extends axially from said ceiling, and wherein said passages are terminated as holes in said internal surface, said holes being evenly spaced apart along a circumference of said internal surface.

9. The reactor of claim 8 wherein said holes comprise plural sets of evenly spaced holes at respective axial locations on said interior surface.

10. The reactor of claim 8 wherein said holes comprise plural sets of holes distributed along said interior surface, respective ones of said sets of holes being oriented at respective angles relative to said interior surface.

11. The reactor of claim 1 wherein said ring comprises a gas manifold comprising:

a gas supply port for receiving a gas from said process gas supply; and a pair of gas outlets oriented in opposing rotational directions along the circumference of said ring;

wherein said succession of gas flow lines comprises:

a first set of said gas flow lines having an input coupled to one of said pair of gas outlets and extending around a first half portion of the circumference of said ring along a first rotational direction, and a second set of said gas flow lines having an input coupled to the other of said pair of gas outlets and extending around a second half portion of the circumference of said ring along a rotation direction opposite said first rotational direction.

12. The reactor of claim 11 further comprising a gas supply line coupled between said process gas supply and said gas supply port of said gas manifold of said ring.

13. The reactor of claim 11 wherein said first set of gas flow lines extends around approximately half of the circumference of said ring and said second set of gas flow lines extends around approximately the other half of the circumference of said ring.

14. The reactor of claim 1 wherein said controller is connected individually to the control inputs of each of said gas flow valves so as to be capable of controlling each of said gas flow valves independently of the other valves.

15. The reactor of claim 1 wherein said gas flow valves are controllable to an ON state and an OFF state.

16. The reactor of claim 1 wherein said gas flow valves are controllable to different gas flow rates between a zero flow rate and a maximum flow rate.

* * * * *